US012701864B2

(12) United States Patent
Lim

(10) Patent No.: US 12,701,864 B2
(45) Date of Patent: Aug. 4, 2026

(54) DISPLAY DEVICE AND FLEXIBLE DISPLAY DEVICE INCLUDING A STORAGE CAPACITOR

(71) Applicant: Samsung Display Co., LTD., Yongin-si (KR)

(72) Inventor: Sang Hyung Lim, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 489 days.

(21) Appl. No.: 18/309,926

(22) Filed: May 1, 2023

(65) Prior Publication Data

US 2024/0138190 A1 Apr. 25, 2024
US 2024/0237407 A9 Jul. 11, 2024

(30) Foreign Application Priority Data

Oct. 25, 2022 (KR) .......................... 10-2022-0138165

(51) Int. Cl.
*H10K 59/12* (2023.01)
*H10K 59/121* (2023.01)

(52) U.S. Cl.
CPC ..... *H10K 59/1216* (2023.02); *H10K 59/1201* (2023.02)

(58) Field of Classification Search
CPC ........................ H10K 59/1216; H10K 59/1201
USPC ............................................................ 257/40
See application file for complete search history.

(56) References Cited

U.S. PATENT DOCUMENTS

| | | | | |
|---|---|---|---|---|
| 11,183,535 | B2 | 11/2021 | Choi | |
| 2013/0270526 | A1* | 10/2013 | Kim | H10D 86/481 |
| | | | | 257/E51.019 |
| 2019/0237508 | A1* | 8/2019 | Choi | G09G 3/32 |
| 2021/0091320 | A1* | 3/2021 | Choi | H10K 59/131 |
| 2022/0149118 | A1* | 5/2022 | Kim | H10K 59/131 |

FOREIGN PATENT DOCUMENTS

| | | |
|---|---|---|
| CN | 111129028 | 5/2020 |
| CN | 112909025 | 6/2021 |
| CN | 113690253 | 11/2021 |
| KR | 10-1051204 | 7/2011 |
| KR | 10-2015-0039015 | 4/2015 |
| KR | 10-2019-0093240 | 8/2019 |
| WO | 2007/029844 | 3/2007 |

OTHER PUBLICATIONS

Extended European Search Report for European Patent Application No. 23192818.5, dated Dec. 18, 2023.

* cited by examiner

*Primary Examiner* — Phuc T Dang
(74) *Attorney, Agent, or Firm* — Harness, Dickey & Pierce, P.L.C.

(57) ABSTRACT

According to an embodiment of the disclosure, a display device includes a pixel circuit layer including a base layer and a pixel circuit disposed on the base layer, and a light emitting element disposed on the base layer and electrically connected to the pixel circuit. The pixel circuit includes a transistor and a storage capacitor including a first capacitor electrode and a second capacitor electrode. The base layer includes a concave portion. At least a portion of each of the first capacitor electrode and the second capacitor electrode is disposed in the concave portion.

30 Claims, 26 Drawing Sheets

LD: EL, ELT1, ELT2

SPX(PXL): SPX1, SPX2, SPX3

FIG. 3

LD: EL, ELT1, ELT2

1(PCL)

| | |
|---|---|
| PROTECTIVE LAYER | ~ PSV |
| INTERLAYER INSULATING LAYER | ~ ILD |
| INTERLAYER CONDUCTIVE LAYER | ~ ICL |
| GATE INSULATING LAYER | ~ GI |
| ACTIVE LAYER | ~ ACT |
| BUFFER LAYER | ~ BFL |
| LOWER AUXILIARY ELECTRODE LAYER | ~ BML |
| BASE LAYER | ~ BSL |

CST

1000

UE

SECOND CAPACITOR ELECTRODE

| FS1(S1) | FS2(S2) | FS1(S1) | FS2(S2) | FS1(S1) |

FIRST CAPACITOR ELECTRODE

A1 ——— CST1(UE, LE)

A2 ——— CST2(UE, LE) } CST

A3  1000 ——— CST3(UE, LE)

DR2
DR3 ⊙ ——► DR1

1(PCL)

| | |
|---|---|
| PROTECTIVE LAYER | PSV |
| SECOND INTERLAYER INSULATING LAYER | ILD2 |
| SECOND INTERLAYER CONDUCTIVE LAYER | ICL2 |
| FIRST INTERLAYER INSULATING LAYER | ILD1 |
| FIRST INTERLAYER CONDUCTIVE LAYER | ICL1 |
| GATE INSULATING LAYER | GI |
| ACTIVE LAYER | ACT |
| BUFFER LAYER | BFL |
| LOWER AUXILIARY ELECTRODE LAYER | BML |
| BASE LAYER | BSL |

DR3

A                                    CA                                    A'

DR3

DISPLAY DEVICE AND FLEXIBLE DISPLAY DEVICE INCLUDING A STORAGE CAPACITOR

CROSS REFERENCE TO RELATED APPLICATION(S)

This application claims priority to and benefits of Korean Patent Application No. 10-2022-0138165 under 35 U.S.C. § 119, filed on Oct. 25, 2022, the entire content of which are incorporated herein by reference.

BACKGROUND

1. Technical Field

Embodiments relate to a display device, a flexible display device, and a manufacturing method for the display device.

2. Description of the Related Art

As information technology is developed, a display device, which provides a variety of information to users, has been important. The display device includes a light emitting element capable of emitting light and a pixel circuit for driving the light emitting element.

The pixel circuit includes a storage capacitor. The storage capacitor has a structure in which two or more electrodes include facing surfaces to form a capacitance.

A large area for disposing the storage capacitor is required on a substrate so that the two or more electrodes of the storage capacitor to form a sufficient capacitance. For example, a process and design for forming the pixel circuit may be restricted due to the limitation in space and area. Therefore, a structure in which the storage capacitor may be efficiently disposed is required.

SUMMARY

Embodiments provide a display device, a flexible display device, and a manufacturing method for the display device, in which a storage capacitor is efficiently disposed, and thus a process and design for a pixel circuit may be readily performed.

However, embodiments are not limited to those set forth herein. The above and other embodiments will become more apparent to one of ordinary skill in the art to which the disclosure pertains by referencing the detailed description of the disclosure given below.

According to an embodiment, a display device may include a pixel circuit layer including a base layer and a pixel circuit disposed on the base layer, and a light emitting element disposed on the base layer and electrically connected to the pixel circuit. The pixel circuit may include a transistor and a storage capacitor including a first capacitor electrode and a second capacitor electrode. The base layer may include a concave portion. At least a portion of each of the first capacitor electrode and the second capacitor electrode may be disposed in the concave portion.

According to an embodiment, the first capacitor electrode and the second capacitor electrode may include facing surfaces facing each other, an insulating layer between the facing surfaces. The facing surfaces may include first facing surfaces and second facing surfaces. The first facing surfaces may extend along a first surface. The second facing surfaces may extend along a second surface different from the first surface. A normal direction of the second surface may be different from a thickness direction of the base layer.

According to an embodiment, a depth of the concave portion may be about 10% to about 95% of a thickness of the base layer.

According to an embodiment, the storage capacitor may include a well portion in the concave portion. The pixel circuit layer may include a lower auxiliary electrode layer, an active layer, and an interlayer conductive layer for forming the pixel circuit. The first capacitor electrode may be formed as the lower auxiliary electrode layer. The second capacitor electrode may be formed as the active layer.

According to an embodiment, the transistor may include a driving transistor. A first source electrode and a first drain electrode of the driving transistor may be formed as the interlayer conductive layer and the first capacitor electrode and the second capacitor electrode of the storage capacitor and the first source electrode and the first drain electrode of the driving transistor are formed on different layers, respectively.

According to an embodiment, the display device may further include a sync conductive layer overlapping a first gate electrode of the driving transistor in a plan view and formed as the lower auxiliary electrode layer. The first capacitor electrode may be electrically connected to the first source electrode and the sync conductive layer, and may be electrically connected to an anode electrode of the light emitting element through a bridge pattern layer formed as the interlayer conductive layer.

According to an embodiment, the display device may further include a data line electrically connected to the pixel circuit. The transistor may further include a switching transistor electrically connected to the data line. A direction in which the data line extends and a direction in which the well portion extends may be parallel.

According to an embodiment, the display device may further include a data line electrically connected to the pixel circuit. The transistor may further include a switching transistor electrically connected to the data line. The well portion may be disposed between a first gate electrode of the driving transistor and a second gate electrode of the switching transistor in a plan view.

According to an embodiment, a direction in which the first gate electrode and the second gate electrode extend and a direction in which the well portion extends may be parallel.

According to an embodiment, the second capacitor electrode and a second source electrode of the switching transistor may be integral with each other, and the second capacitor electrode and a second drain electrode of the switching transistor may be integral with each other.

According to an embodiment, the well portion may not overlap the interlayer conductive layer in a plan view.

According to an embodiment, the display device may further include a first sub-pixel, a second sub-pixel, and a third sub-pixel each including the light emitting element. The storage capacitor may include a well portion in the concave portion. The storage capacitor may include a first storage capacitor in the first sub-pixel, a second storage capacitor in the second sub-pixel, and a third storage capacitor in the third sub-pixel. Each of the first storage capacitor, the second storage capacitor, and the third storage capacitor may include the well portion.

According to an embodiment, the display device may further include a first sub-pixel, a second sub-pixel, and a third sub-pixel each including the light emitting element. The storage capacitor may include a well portion in the concave portion. The storage capacitor may include a first storage capacitor of the first sub-pixel, a second storage capacitor in the second sub-pixel, and a third storage capacitor in the third sub-pixel. The well portion may not be formed in the first storage capacitor and the second storage capacitor. The well portion may be formed in the third storage capacitor. A capacitance of the third storage capacitor may be greater than a capacitance of the first storage capacitor and a capacitance of the second storage capacitor.

According to an embodiment, areas of each of the first storage capacitor, the second storage capacitor, and the third storage capacitor may be substantially equal to each other in a plan view.

According to an embodiment, structures of each of the first storage capacitor, the second storage capacitor, and the third storage capacitor may be substantially same as each other in a plan view.

According to an embodiment, the pixel circuit layer may include a circuit-free area in which the pixel circuit is not disposed. The base layer may be configured to transmit light so that the display device has a rear emission structure.

According to an embodiment, the storage capacitor may include a well portion in the concave portion. The well portion may have a shape including a long side extending in a first direction and a short side extending in a second direction different from the first direction.

According to an embodiment, the storage capacitor may include a well portion in the concave portion. The well portion may include a plurality of well portions. The plurality of well portions may be arranged in a matrix structure in a row direction along a first direction and a column direction along a second direction different from the first direction.

According to an embodiment, the storage capacitor may include a well portion in the concave portion. The well portion may include a plurality of well portions. The plurality of well portions may be sequentially arranged along a direction.

According to an embodiment, the light emitting element may be an organic light emitting diode (OLED).

According to an embodiment, the display device may be one or more of a bendable display device, a curved display device, and a foldable display device.

According to an embodiment, the display device may be bendable along a bending line. The storage capacitor may include a well portion in the concave portion. A direction in which the bending line extends and a direction in which the well portion extends may be same as each other.

According to an embodiment, the transistor may include a gate electrode formed as a first interlayer conductive layer, and a source electrode and a drain electrode formed as a second interlayer conductive layer on the first interlayer conductive layer. The first capacitor electrode may be formed as the first interlayer conductive layer. The second capacitor electrode may be formed as the second interlayer conductive layer.

According to an embodiment, a display device may include a base layer; a pixel circuit layer disposed on the base layer and including a pixel circuit; and a light emitting element disposed on the base layer and electrically connected to the pixel circuit. The pixel circuit may include a transistor and a storage capacitor including a first capacitor electrode and a second capacitor electrode that form facing surfaces facing each other. The facing surfaces may include first facing surfaces along a first plane and second facing surfaces along a second plane forming an angle with the first plane. A normal direction of the second plane may be different from a thickness direction of the base layer.

According to an embodiment, a flexible display device that is configured to be folded along a bending line may include a base layer including a recessed portion, a pixel circuit including a storage capacitor including capacitor electrodes disposed in the recessed portion, and a light emitting element electrically connected to the pixel circuit. The recessed portion may have a shape extending along the bending line.

According to an embodiment, a manufacturing method for a display device may include forming a concave portion by removing at least a portion of a base layer, forming lower lines on the base layer, and forming a light emitting element on the base layer. The forming of the lower lines may include forming a lower auxiliary electrode layer, an active layer, and an interlayer conductive layer. The forming of the lower auxiliary electrode layer may include patterning a first capacitor electrode of a storage capacitor in the concave portion. The forming of the active layer may include patterning a second capacitor electrode of the storage capacitor in the concave portion.

According to an embodiment, the first capacitor electrode and the second capacitor electrode may include facing surfaces facing each other, an insulating layer disposed between the facing surfaces. The facing surfaces may include first facing surfaces and second facing surfaces. The first facing surfaces may extend along a first surface. The second facing surfaces may extend along a second surface different from the first surface. A normal direction of the second surface may be different from a thickness direction of the base layer.

According to an embodiment, the base layer may include a glass substrate. The forming of the concave portion may include performing a wet etching process on the base layer.

According to an embodiment, the base layer may include polyimide. The forming of the concave portion may include performing a laser process on the base layer.

According to an embodiment, the forming of the lower lines may include forming a driving transistor and a switching transistor. The forming of the active layer may include forming a first active layer of the driving transistor and forming a second active layer and a second source electrode of the switching transistor. The forming of the interlayer conductive layer may include forming a first source electrode, a first gate electrode, a first drain electrode of the driving transistor, a second gate electrode and a second drain electrode of the switching transistor. The first capacitor electrode may be electrically connected to the first source electrode of the driving transistor. The second capacitor electrode may be electrically connected to the second drain electrode of the switching transistor.

According to an embodiment, a display device, a flexible display device, and a manufacturing method for the display device, in which a storage capacitor may be efficiently disposed, and thus a process and design for a pixel circuit may be readily performed.

BRIEF DESCRIPTION OF THE DRAWINGS

FIG. 3 is a block diagram illustrating a display device according to an embodiment;

FIG. 9 is a schematic block diagram illustrating a structure of a storage capacitor according to an embodiment;

FIG. 19 is a schematic plan view illustrating the area of storage capacitors of sub-pixels according to an embodiment;

DETAILED DESCRIPTION OF THE EMBODIMENTS

Figure 1:
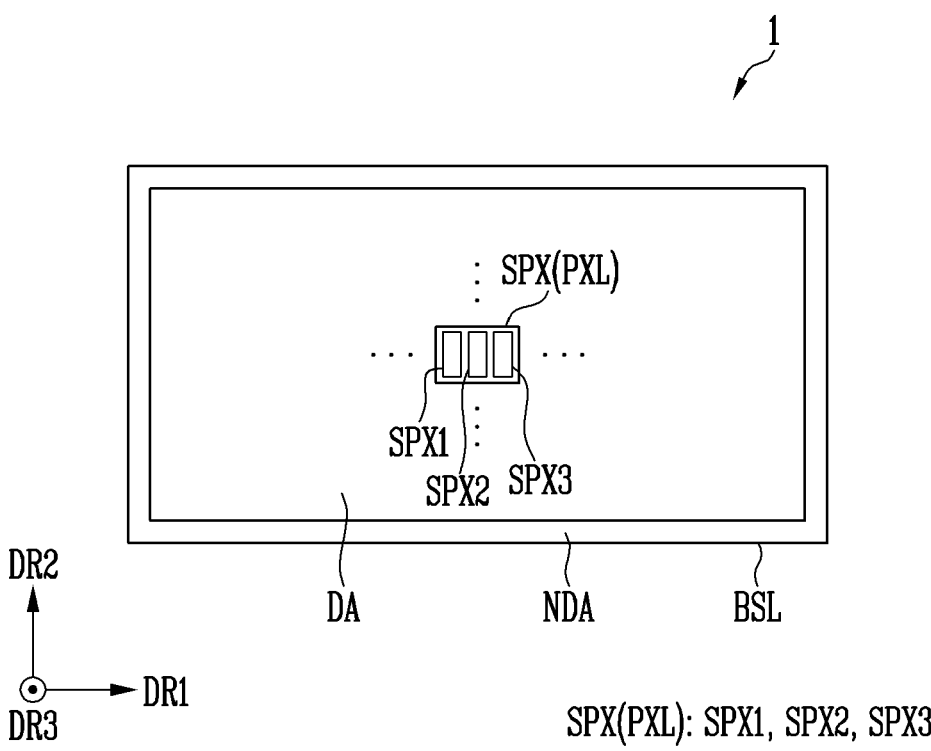
FIGS. 1 and 2 are schematic plan views illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

The disclosure relates to a display device, a flexible display device, and a manufacturing method for the display device. Hereinafter, a display device, a flexible display device, and a manufacturing method for the display device according to an embodiment are described with reference to the accompanying drawings.

Figure 2:
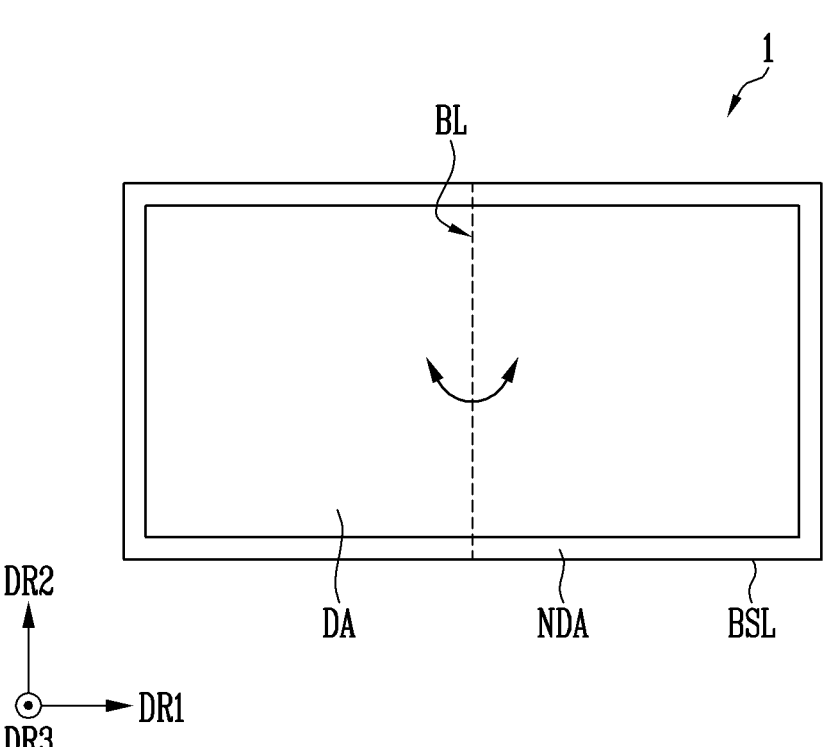
Figure 3:
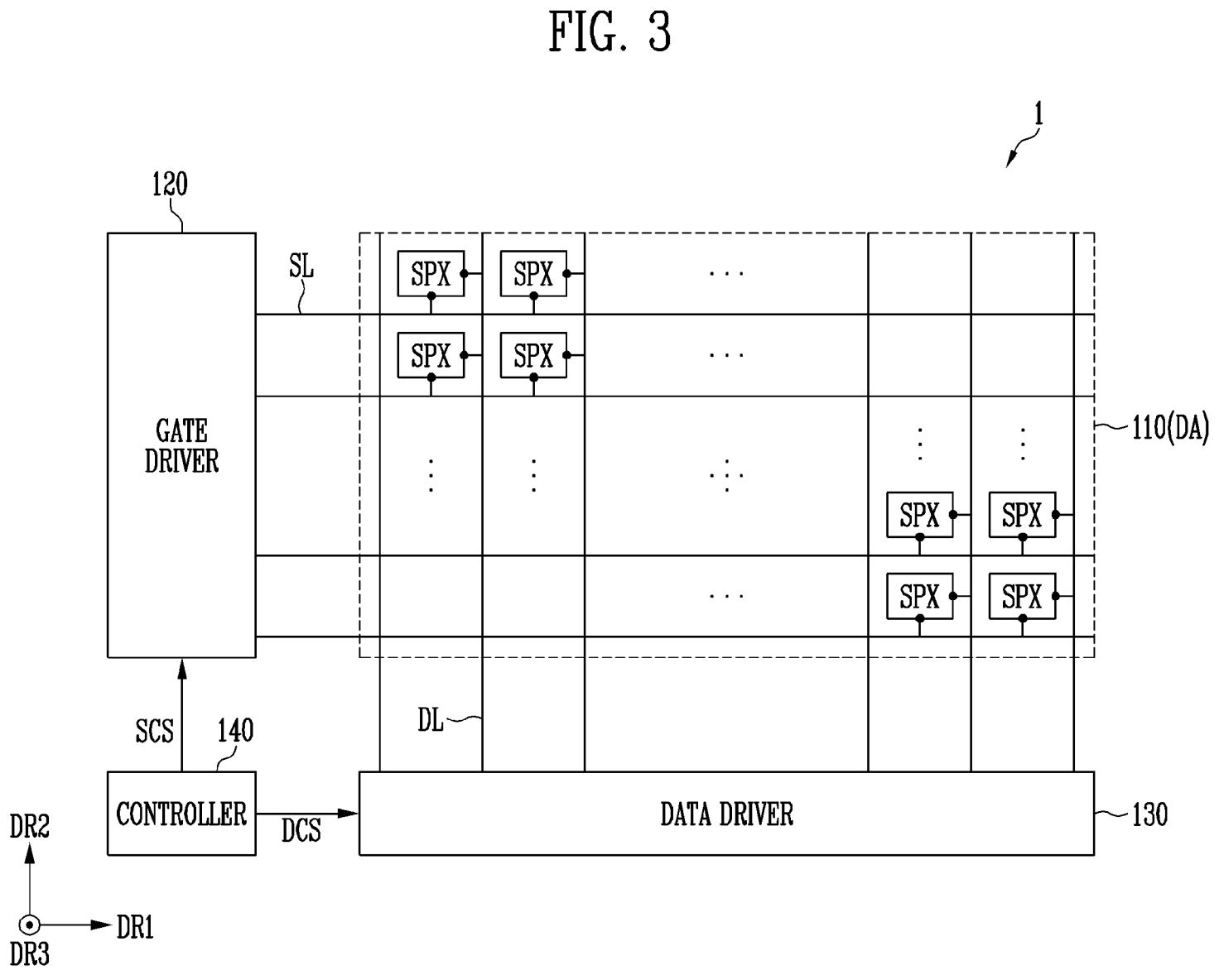

A display device 1 according to an embodiment is described with reference to FIGS. 1 to 3. FIGS. 1 and 2 are schematic plan views illustrating a display device according to an embodiment. FIG. 3 is a block diagram illustrating a display device according to an embodiment.

The display device 1 may emit light. The display device 1 may be an electronic device including, e.g., a light emitting element LD (refer to FIG. 4) as a light source. The display device 1 may be applied to various devices, and an applicable device is not limited to a specific example.

According to an embodiment, the display device 1 may be a flexible display device. For example, the display device 1 may be one or more of a rollable display device, a bendable display device, a curved display device, and a foldable display device. For example, the display device 1 may be folded along a bending line BL (refer to FIG. 2). According to an embodiment, the bending line BL may extend along a second direction DR2, and a direction, in which the bending line BL extends, may correspond to a direction in which a well portion 1000 (refer to FIG. 9) included in a storage capacitor CST extends. A detailed content related to this is described below.

The display device 1 may include a base layer BSL and a sub-pixel SPX on the base layer BSL. Sub-pixels SPX may be provided to form one or more pixels PXL. The display device 1 may include a display area DA and a non-display area NDA. The non-display area NDA may mean an area except for the display area DA. The non-display area NDA may surround at least a portion of the display area DA.

The base layer BSL may form a base member of the display device 1. The base layer BSL may be a rigid or flexible substrate or film. For example, the base layer BSL may include a glass substrate (or tempered glass substrate). In another example, the base layer BSL may include a flexible substrate or a flexible film including plastic or metal. In another example, the base layer BSL may have a structure including an insulating layer. According to an embodiment, in case that the display device 1 is a flexible display device, the base layer BSL may include an insulating material such as a polymer resin such as polyimide. According to an embodiment, the base layer BSL may be substantially transparent. For example, an embodiment in which the display device 1 has a rear emission structure may be implemented. However, embodiments are not limited to a specific example.

The display area DA may refer to an area where the sub-pixel SPX is disposed. The non-display area NDA may refer to an area in which the sub-pixel SPX is not disposed. A line, a pad, and the like connected (e.g., electrically connected) to the sub-pixel SPX may be disposed in the non-display area NDA.

According to an embodiment, the pixel PXL (or the sub-pixels SPX) may include a first sub-pixel SPX1, a second sub-pixel SPX2, and a third sub-pixel SPX3. One or more of the first sub-pixel SPX1, the second sub-pixel SPX2, and the third sub-pixel SPX3 may form a pixel unit. For example, each of the first sub-pixel SPX1, the second sub-pixel SPX2, and the third sub-pixel SPX3 may emit light of one color. For example, the first sub-pixel SPX1 may be a green pixel emitting light of green (for example, first color), the second sub-pixel SPX2 may be a red pixel emitting light of red (for example, second color), and the third sub-pixel SPX3 may be a blue pixel emitting light of blue (for example, third color).

According to an embodiment, the display device 1 may include a pixel unit 110, a gate driver 120, a data driver 130, and a controller 140.

The pixel unit 110 may include the sub-pixels SPX disposed in the display area DA. The pixel unit 110 may include the sub-pixels SPX connected to a scan line SL and a data line DL.

The gate driver 120 may be disposed on a side of the pixel unit 110. The gate driver 120 may receive a first control signal SCS from the controller 140. The gate driver 120 may provide a scan signal to the sub-pixel SPX. The gate driver 120 may supply the scan signal to the scan lines SL extending in a first direction DR1 in response to the first control signal SCS. The scan signal may be provided to the sub-pixels SPX through the scan lines SL.

The first control signal SCS may be a signal for controlling a driving timing of the gate driver 120. The first control signal SCS may include a scan start signal and clock signals for the scan signal. The scan signal may be set to a gate-on level corresponding to a type of a transistor to which a corresponding scan signal is supplied.

The data driver 130 may be disposed on a side of the pixel unit 110. The data driver 130 may receive a second control signal DCS from the controller 140. The data driver 130 may provide a data signal to the sub-pixel SPX. The data driver 130 may supply the data signal to the data line DL extending in a second direction DR2 in response to the second control signal DCS. For example, the second control signal DCS may be provided to the sub-pixel SPX through the data line DL. The second control signal DCS may be a signal for controlling a driving timing of the data driver 130.

According to an embodiment, the display device 1 may further include a compensator. The compensator may receive a third control signal for sensing and deterioration compensation of the sub-pixels SPX from the controller 140. The compensator may receive a sensing value (e.g., current or voltage information) extracted from the sub-pixel SPX through a sensing line SENL (refer to FIG. 5). The compensator may generate a compensation value for compensating for the deterioration of the sub-pixel SPX based on the sensing value.

The scan line SL may extend along a pixel row (for example, the first direction DR1) and may be connected (e.g., electrically connected) to the sub-pixel SPX. The data line DL may extend along a pixel column (for example, the second direction DR2) and may be connected (e.g., electrically connected) to the sub-pixel SPX.

In FIG. 3, the gate driver 120, the data driver 130, and the controller 140 are shown separately, but at least a portion of the gate driver 120, the data driver 130, and the controller 140 may be integrated into a single module or integrated circuit (IC) chip.

Figure 4:
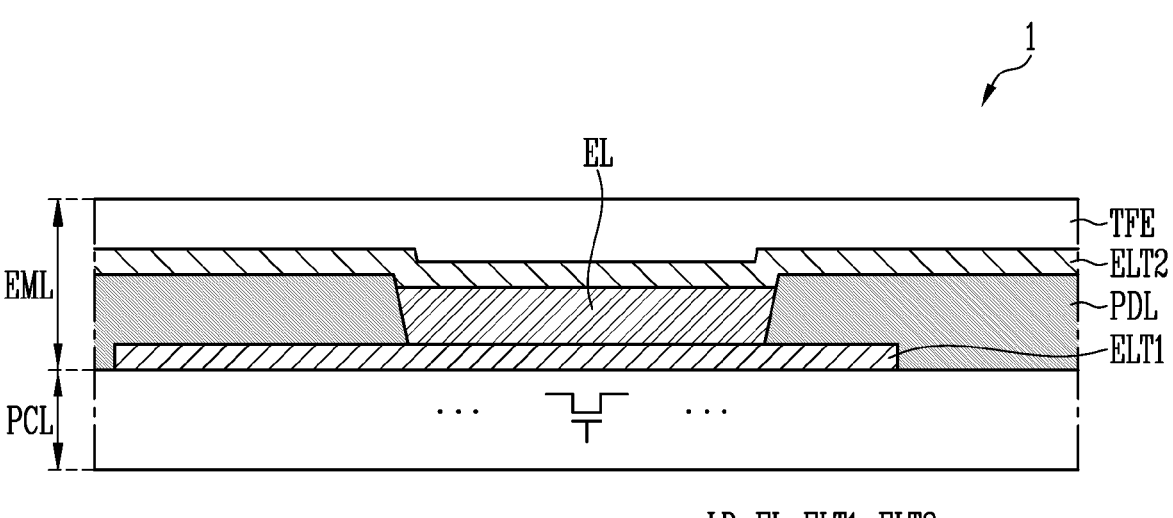
FIG. 4 is a schematic cross-sectional view illustrating a display device according to an embodiment.

For example, a stack structure of the display device 1 for forming the sub-pixel SPX according to an embodiment is described with reference to FIG. 4. FIG. 4 is a schematic cross-sectional view illustrating a display device according to an embodiment.

According to an embodiment, the display device 1 (or the sub-pixel SPX) may include light emitting elements LD. According to an embodiment, the light emitting elements LD may be provided in various forms. In the description, for convenience of description, the disclosure is described based on an embodiment in which the light emitting elements LD are organic light emitting diodes (OLEDs).

Referring to FIG. 4, the display device 1 may include a pixel circuit layer PCL and a light-emitting-element layer EML.

The pixel circuit layer PCL may include a pixel circuit PXC (refer to FIG. 5) for driving the light emitting elements LD. The pixel circuit layer PCL may include a base layer BSL, conductive layers for forming pixel circuits, and insulating layers disposed between the conductive layers. A detailed description of a stack structure for forming the pixel circuit layer PCL is described below with reference to drawings after FIG. 6.

The pixel circuit PXC may include a thin film transistor and may be connected (e.g., electrically connected) to the light emitting elements LD to provide an electrical signal for the light emitting elements LD to emit light. A structure of the pixel circuit PXC is described below with reference to FIG. 5.

The light-emitting-element layer EML may be disposed on the pixel circuit layer PCL. According to an embodiment, the light-emitting-element layer EML may include the light emitting element LD, a pixel defining layer PDL, and a thin film encapsulation layer TFE.

The light emitting element LD may be disposed on the pixel circuit layer PCL. According to an embodiment, the light emitting element LD may include a first electrode ELT1, a light emitting layer EL, and a second electrode ELT2. According to an embodiment, the light emitting layer EL may be disposed in an area defined by the pixel defining layer PDL. A surface of the light emitting layer EL may be connected (e.g., electrically connected) to the first electrode ELT1, and another surface of the light emitting layer EL may be connected (e.g., electrically connected) to the second electrode ELT2.

The first electrode ELT1 may be an anode electrode for the light emitting layer EL, and the second electrode ELT2 may be a common electrode (or a cathode electrode) for the light emitting layer EL. According to an embodiment, the first electrode ELT1 and the second electrode ELT2 may include a conductive material. For example, the first electrode ELT1 may include a conductive material having a reflective property, and the second electrode ELT2 may include a transparent conductive material, but embodiments are not limited thereto.

The light emitting layer EL may have a multilayer thin film structure including a light generation layer. The light emitting layer EL may include a hole injection layer for injecting a hole, a hole transport layer having an excellent hole transport property and for increasing a chance of recombination of a hole and an electron by suppressing a movement of an electron that is not combined in the light generation layer, the light generation layer for emitting light by the recombination of the injected electron and hole, a hole blocking layer for suppressing a movement of a hole that is not combined in the light generation layer, an electron transport layer for smoothly transporting the electron to the light generation layer, and an electron injection layer for injecting the electron. The light emitting layer EL may emit light based on an electrical signal provided from the first electrode ELT1 and the second electrode ELT2.

The pixel defining layer PDL may be disposed on the pixel circuit layer PCL to define a position where the light emitting layer EL is arranged. The pixel defining layer PDL may include an organic material. According to an embodiment, the pixel defining layer PDL may include one or more of a group of acrylic resin, epoxy resin, phenol resin, polyamide resin, and polyimide resin. However, embodiments are not limited thereto.

The thin film encapsulation layer TFE may be disposed on the light emitting element LD (for example, the second electrode ELT2). The thin film encapsulation layer TFE may offset (or planarize) a step difference generated by the light emitting element LD and the pixel defining layer PDL. The thin film encapsulation layer TFE may include insulating layers covering the light emitting element LD. According to an embodiment, the thin film encapsulation layer TFE may have a structure in which an inorganic layer and an organic layer are alternately stacked.

Figure 5:
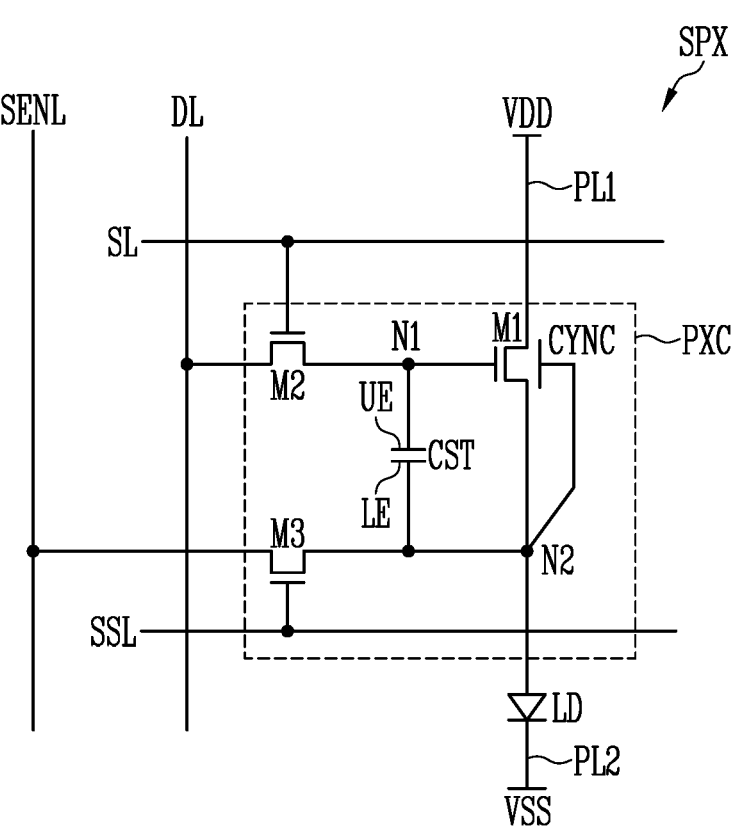
FIG. 5 is a schematic diagram illustrating a pixel circuit included in a sub-pixel according to an embodiment.

For example, a pixel circuit PXC according to an embodiment is described with reference to FIG. 5. FIG. 5 is a schematic diagram illustrating a pixel circuit included in a sub-pixel according to an embodiment. Referring to FIG. 5, the sub-pixel SPX may include the pixel circuit PXC. The pixel circuit PXC may drive the light emitting elements LD. According to an embodiment, each of the sub-pixels SPX for forming one pixel unit may include the pixel circuit PXC.

The pixel circuit PXC may be connected (e.g., electrically connected) to the scan line SL, the data line DL, a first power line PL1, and a second power line PL2. The pixel circuit PXC may be further connected (e.g., electrically connected) to the sensing line SENL.

The light emitting elements LD may emit light corresponding to a data signal provided from the data line DL.

The pixel circuit PXC may be disposed between the first power line PL1 and the light emitting elements LD. The pixel circuit PXC may be connected (e.g., electrically connected) to the scan line SL to which a first scan signal is supplied and the data line DL to which the data signal is supplied. The pixel circuit PXC may be connected (e.g., electrically connected) to a scan control line SSL to which a second scan signal is supplied, and may be connected (e.g., electrically connected) to reference power (or initialization power) or the sensing line SENL connected to a sensing circuit. According to an embodiment, the second scan signal may be the same as or different from the first scan signal. In case that the second scan signal and the first scan signal are the same as each other, the scan control line SSL may be integrated with the scan line SL. However, embodiments are not limited thereto.

The pixel circuit PXC may include one or more circuit elements. For example, the pixel circuit PXC may include a first transistor M1, a second transistor M2, a third transistor M3, and a storage capacitor CST.

The first transistor M1 may be connected (e.g., electrically connected) between the first power line PL1 and a second node N2. The second node N2 may be a node to which the pixel circuit PXC and the light emitting element LD are connected. For example, the second node N2 may be a node connected to an electrode (e.g., first source electrode SE1 in FIG. 8) of the first transistor M1 and the first electrode ELT1 of the light emitting element LD. A first gate electrode GE1 (refer to FIG. 8) of the first transistor M1 may be connected (e.g., electrically connected) to a first node N1. The first transistor M1 may control a driving current supplied to the light emitting element LD in response to a voltage of the first node N1. The first transistor M1 may be a driving transistor.

According to an embodiment, a sync electrode layer CYNC connected (e.g., electrically connected) to the second node N2 to receive an anode signal supplied to the light emitting element LD may be disposed under the first transistor M1 (for example, the gate electrode of the first transistor M1).

The second transistor M2 may be connected (e.g., electrically connected) between the data line DL and the first node N1. For example, a second gate electrode GE2 (refer to FIG. 8) of the second transistor M2 may be connected (e.g., electrically connected) to the scan line SL. The second transistor M2 may be turned on to electrically connect the data line DL and the first node N1 in case that a first scan signal of a gate-on voltage (for example, a high level voltage) is supplied from the scan line SL.

For each frame period, a data signal of a corresponding frame may be supplied to the data line DL, and the data signal may be transferred to the first node N1 through the second transistor M2 during a period in which the first scan signal of the gate-on voltage is supplied. The second transistor M2 may be a switching transistor for transferring each data signal to an inside of the sub-pixel SPX.

A first capacitor electrode LE of the storage capacitor CST may be connected (e.g., electrically connected) to the second node N2, and a second capacitor electrode UE of the storage capacitor CST may be connected (e.g., electrically connected) to the first node N1. The storage capacitor CST may charge a voltage corresponding to the data signal supplied to the first node N1 during each frame period.

The third transistor M3 may be connected (e.g., electrically connected) between the second node N2 and the sensing line SENL. A third gate electrode GE3 (refer to FIG. 8) of the third transistor M3 may be connected to the scan control line SSL. The third transistor M3 may be turned on, in case that a second scan signal (or a first scan signal) of a gate-on voltage (for example, a high level voltage) is supplied from the scan control line SSL, to transfer a reference voltage (or an initialization voltage) supplied to the sensing line SENL to the second node N2, or to transfer a voltage of the second node N2 to the sensing line SENL. The voltage of the second node N2 transferred to a sensing circuit through the sensing line SENL may be provided to an external circuit (for example, the controller 140) to be used for compensating (or preventing) a characteristic deviation of the sub-pixels SPX.

In FIG. 5, all of the transistors included in the pixel circuit PXC are N-type transistors, but embodiments are not limited thereto. For example, at least one of the first, second, and third transistors M1, M2, and M3 may be changed to a P-type transistor. For example, a structure and a driving method of the sub-pixel SPX may be variously changed according to an embodiment.

The light emitting element LD may be connected (e.g., electrically connected) between the first power line PL1 and the second power line PL2. For example, the first electrode ELT1 of the light emitting element LD may be connected (e.g., electrically connected) to the pixel circuit PXC, and the second electrode ELT2 of the light emitting element LD may be connected (e.g., electrically connected) to the second power line PL2.

Power of the first power line PL1 and power of the second power line PL2 may have different potentials. For example, the power of the first power line PL1 may be high potential pixel power supplied from first power VDD, and the power of the second power line PL2 may be low potential pixel power supplied from second power VSS. A potential difference between the power of the first power line PL1 and the power of the second power line PL2 may be set to a threshold voltage or higher of the light emitting elements LD.

The first power line PL1 may be connected (e.g., electrically connected) to the first transistor M1. The second power line PL2 may be connected (e.g., electrically connected) to the cathode electrode (for example, the second electrode ELT2) of the light emitting element LD.

Each light emitting element LD may be connected in a forward-bias direction between the first power line PL1 and the second power line PL2 to form each effective light source. The effective light sources may form the light emitting elements LD of the sub-pixel SPX.

The light emitting elements LD may emit light with a luminance corresponding to the driving current supplied through the pixel circuit PXC. During each frame period, the pixel circuit PXC may supply the driving current corresponding to the data signal to the light emitting element LD. The light emitting element LD may emit light with a luminance corresponding to a current flowing therethrough.

The pixel circuit PXC for the sub-pixel SPX according to an embodiment is not limited to the above-described example. According to an embodiment, the pixel circuit PXC may further include seven transistors and one storage capacitor.

For example, a structure of electrodes of the display device 1 according to an embodiment is described with reference to FIGS. 6 to 20. A description for a content that is same as (or similar to) the above-described content is simplified or is not repeated for descriptive convenience.

Figure 6:
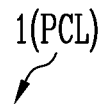
FIG. 6 is a schematic cross-sectional view illustrating a stack structure of a display device according to an embodiment.
Figure 6:
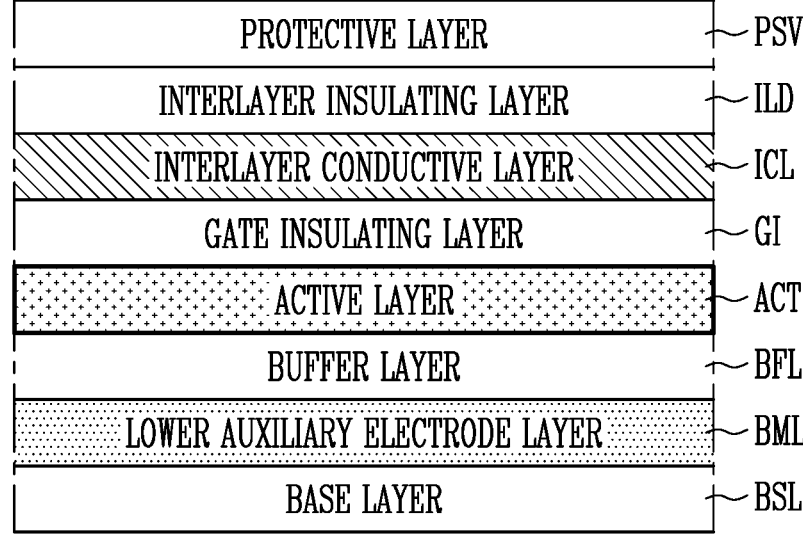
Figure 6:
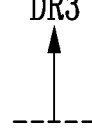

FIG. 6 is a schematic cross-sectional view illustrating a stack structure of a display device according to an embodiment. Referring to FIG. 6, a stack structure included in the display device 1 (for example, the pixel circuit layer PCL) according to an embodiment may have a form in which at least a portion is patterned in a structure in which a base layer BSL, a lower auxiliary electrode layer BML, a buffer layer BFL, an active layer ACT, a gate insulating layer GI, an interlayer conductive layer ICL, an interlayer insulating layer ILD, and a protective layer PSV are sequentially stacked. For example, the above-described electrode layers may be patterned according to a structure to form the pixel circuit PXC. The lower auxiliary electrode layer BML, the active layer ACT, and the interlayer conductive layer ICL formed on the base layer BSL may be referred to as a lower line.

The base layer BSL may form (or configure) a base surface of the display device 1. As described above, the base layer BSL may include various materials, and an example thereof is not particularly limited.

The buffer layer BFL may be a layer for preventing diffusion (or permeation) of an impurity or moisture permeation to the active layer ACT including a semiconductor. According to an embodiment, the buffer layer BFL may include one or more of a group of silicon nitride ($SiN_x$), silicon oxide (SiOx), silicon oxynitride ($SiO_xN_y$), and aluminum oxide ($AlO_x$). However, embodiments are not limited to the above-described example.

The active layer ACT may include the semiconductor. For example, the active layer ACT may include one or more of a group of polysilicon, low temperature polycrystalline silicon (LTPS), amorphous silicon, and an oxide semiconductor. According to an embodiment, the active layer ACT may include an oxide semiconductor to form an electrode of the storage capacitor CST.

The active layer ACT may form a channel of the first transistor M1, the second transistor M2, and the third transistor M3. For example, a portion, which contacts source electrodes SE1, SE2, and SE3 or drain electrodes DE1, DE2, and DE3 of the first transistor M1, the second transistor M2, and the third transistor M3, may be doped with an impurity as a portion of the interlayer conductive layer ICL.

The lower auxiliary electrode layer BML and the interlayer conductive layer ICL may include a conductive material. According to an embodiment, each of the lower auxiliary electrode layer BML and the interlayer conductive layer ICL may include one or more conductive layers. According to an embodiment, each of the lower auxiliary electrode layer BML and the interlayer conductive layer ICL may include one or more of a group of gold (Au), silver (Ag), aluminum (Al), molybdenum (Mo), chromium (Cr), titanium (Ti), nickel (Ni), neodymium (Nd), copper (Cu), and platinum (Pt). However, embodiments are not limited to the above-described example.

The gate insulating layer GI and the interlayer insulating layer ILD may be disposed on the active layer ACT and the interlayer conductive layer ICL. The protective layer PSV may be disposed on the interlayer insulating layer ILD. According to an embodiment, two or more of the lower auxiliary electrode layer BML, the active layer ACT, and the interlayer conductive layer ICL may be connected (e.g., electrically connected) to each other through a contact member CH (refer to FIG. 7) formed on one or more of the gate insulating layer GI and the interlayer insulating layer ILD. The interlayer conductive layer ICL or the active layer ACT may be connected (e.g., electrically connected) to the first electrode ELT1 through contact portions (for example, a first contact portion CNT1 (refer to FIG. 8) and a second contact portion CNT2 (refer to FIG. 8) formed in the protective layer PSV.

The gate insulating layer GI and the interlayer insulating layer ILD may include an inorganic material. The protective layer PSV may include an organic material. The protective layer PSV may be a via layer. However, embodiments are not limited to a specific example.

For example, a planar structure of electrodes for forming the pixel circuit layer PCL is described with reference to FIGS. 7 and 8. In the following drawings, the same layer as the layers described above with reference to FIG. 6 (for example, patterning in the same process) may be expressed as the same patterning.

Figure 7:
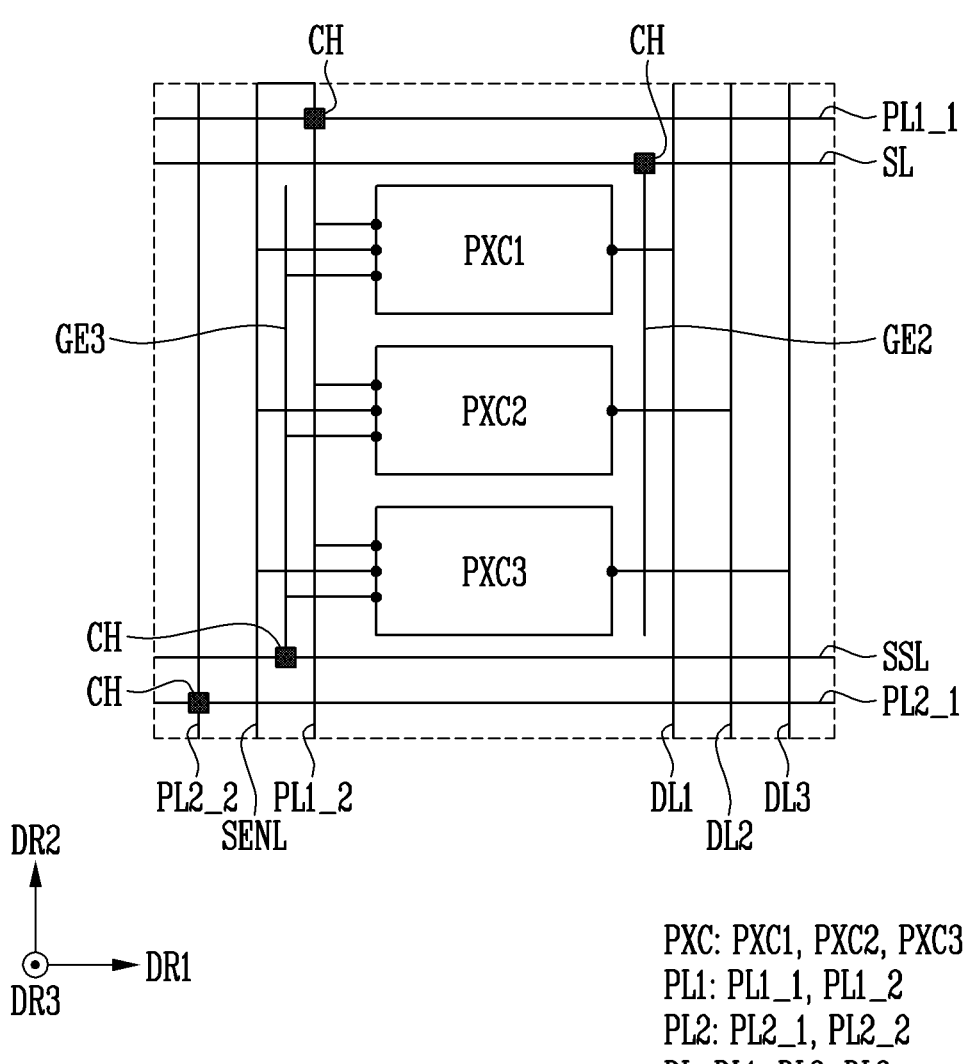
FIGS. 7 and 8 are schematic plan views illustrating an electrode structure according to an embodiment.
Figure 8:
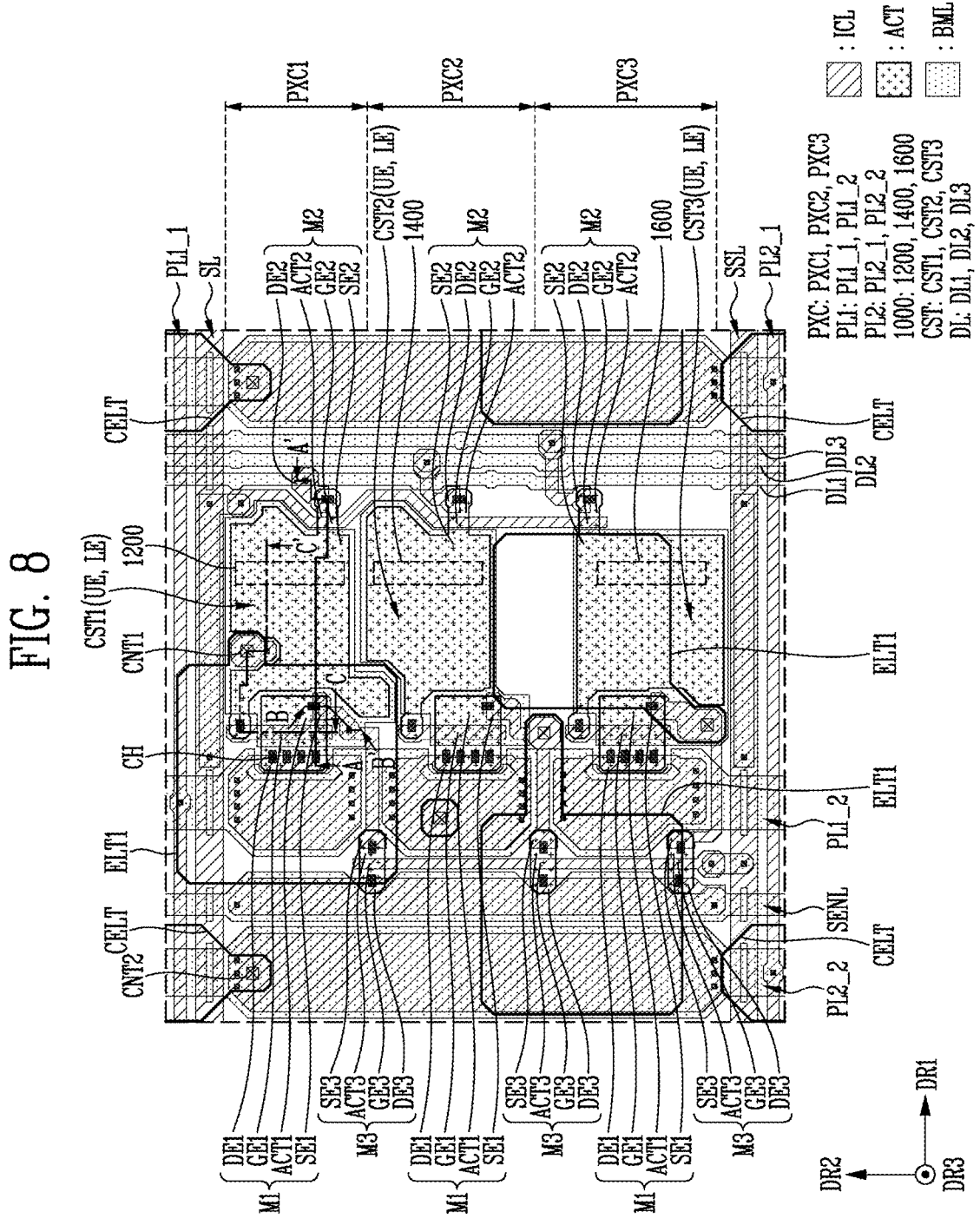

FIGS. 7 and 8 are schematic plan views illustrating an electrode structure according to an embodiment. FIG. 8 shows the lower auxiliary electrode layer BML, the active layer ACT, and the interlayer conductive layer ICL. In FIG. 8, in order to describe a positional relationship between the electrodes of the pixel circuit layer PCL and the light-emitting-element layer EML, a connection electrode CELT for electrically connecting the first electrode ELT1 and the second electrode ELT2 of the light-emitting-element layer EML and the second power line PL2 is further shown.

In FIGS. 7 and 8, the contact portions CNT1 and CNT2 are illustrated as the X mark disposed in a quadrangular shape. In FIGS. 7 and 8, the contact members CH for electrically connecting different pattern layers (for example, the lower auxiliary electrode layer BML, the active layer ACT, and the interlayer conductive layer ICL) is shown as a quadrangular shape expressed by a relatively darker patterning.

The pixel circuits PXC and lines connected to the pixel circuits PXC may be disposed (or patterned).

For example, the pixel circuit PXC may include a first pixel circuit PXC1, a second pixel circuit PXC2, and a third pixel circuit PXC3. Each of the first pixel circuit PXC1, the second pixel circuit PXC2, and the third pixel circuit PXC3 may include the first transistor M1, the second transistor M2, the third transistor M3, and the storage capacitor CST. The first pixel circuit PXC1, the second pixel circuit PXC2, and the third pixel circuit PXC3 may be spaced apart from each other along the second direction DR2. Each of the first pixel circuit PXC1, the second pixel circuit PXC2, and the third pixel circuit PXC3 may be the pixel circuit PXC for each of the sub-pixels SPX different from each other.

The first transistor M1 of each of the first pixel circuit PXC1, the second pixel circuit PXC2, and the third pixel circuit PXC3 may include a first source electrode SE1, a first gate electrode GE1, a first drain electrode DE1, and a first active layer ACT1. According to an embodiment, the second transistor M2 of each of the first pixel circuit PXC1, the second pixel circuit PXC2, and the third pixel circuit PXC3 may include a second source electrode SE2, a second gate electrode GE2, a second drain electrode DE2, and a second active layer ACT2. According to an embodiment, the third transistor M3 of each of the first pixel circuit PXC1, the second pixel circuit PXC2, and the third pixel circuit PXC3 may include a third source electrode SE3, a third gate electrode GE3, a third drain electrode DE3, and a third active layer ACT3.

The storage capacitor CST may include the first capacitor electrode LE and the second capacitor electrode UE. According to an embodiment, the first capacitor electrode LE may be formed as the lower auxiliary electrode layer BML. The second capacitor electrode UE may be formed as the active layer ACT. The first capacitor electrode LE may be a lower electrode. The second capacitor electrode UE may be an upper electrode. According to an embodiment, the storage capacitor CST may include a first storage capacitor CST1 of the first pixel circuit PXC1, a second storage capacitor CST2 of the second pixel circuit PXC2, and a third storage capacitor CST3 of the third pixel circuit PXC3.

The storage capacitor CST may include a well portion 1000. According to an embodiment, the well portion 1000 may be a recessed portion. According to an embodiment, the well portion 1000 may be a vertical facing surface forming portion.

The well portion 1000 may include a first well portion 1200, a second well portion 1400, and a third well portion 1600. The first well portion 1200 may be included in the first storage capacitor CST1. The second well portion 1400 may be included in the second storage capacitor CST2. The third well portion 1600 may be included in the third storage capacitor CST3. A detailed description of the well portion 1000 is described below with reference to FIGS. 9 to 20.

The scan line SL may extend in the first direction DR1. The scan line SL may be formed as the interlayer conductive layer ICL. The scan line SL may be connected (e.g., electrically connected) to the second gate electrode GE2 through the contact member CH and a portion of the lower auxiliary electrode layer BML.

The data lines DL may extend in the second direction DR2. The data lines DL may be spaced apart from each other in the first direction DR1. The data lines DL may include a first data line DL1, a second data line DL2, and a third data line DL3. The first data line DL1 may be a data line for the first pixel circuit PXC1 and may be connected (e.g., electrically connected) to the second drain electrode DE2 of the first pixel circuit PXC1. The second data line DL2 may be a data line for the second pixel circuit PXC2 and may be connected (e.g., electrically connected) to the second drain electrode DE2 of the second pixel circuit PXC2. The third data line DL3 may be a data line for the third pixel circuit PXC3 and may be connected (e.g., electrically connected) to the second drain electrode DE2 of the third pixel circuit PXC3.

The scan control line SSL may extend in the first direction DR1. The scan control line SSL may be formed as the interlayer conductive layer ICL. The scan control line SSL may be connected (e.g., electrically connected) to the third gate electrode GE3 through the contact member CH and a portion of the lower auxiliary electrode layer BML.

The sensing line SENL may extend in the second direction DR2. The sensing line SENL may be connected (e.g., electrically connected) to the third drain electrode DE3 of the third transistor M3 of the first to third pixel circuits PXC1, PXC2, and PXC3.

The first power line PL1 may include a (1_1)-th power line PL1_1 extending in the first direction DR1 and a (1_2)-th power line PL1_2 extending in the second direction DR2. Accordingly, the first power line PL1 may form a mesh shape to supply the first power VDD to each of the sub-pixels SPX. The first power line PL1 may be formed as the interlayer conductive layer ICL and the lower auxiliary electrode layer BML. The first power line PL1 may be connected (e.g., electrically connected) to the first drain electrode DE1 of the first transistor M1 of the first to third pixel circuits PXC1, PXC2, and PXC3.

The second power line PL2 may include a (2_1)-th power line PL2_1 extending in the first direction DR1 and a (2_2)-th power line PL2_2 extending in the second direction DR2. Accordingly, the second power line PL2 may form a mesh shape to supply the second power VSS to each of the sub-pixels SPX. The second power line PL2 may be formed as the interlayer conductive layer ICL and the lower auxiliary electrode layer BML.

The second power line PL2 may be connected (e.g., electrically connected) to the connection electrode CELT through the second contact portion CNT1. The connection electrode CELT may be connected (e.g., electrically connected) to the second electrode ELT2 through another contact structure in the light-emitting-element layer EML. Accordingly, the second power VSS of the second power line PL2 may be supplied to the second electrode ELT2.

The first electrode ELT1 may be an anode electrode of each of the first to third sub-pixels SPX1, SPX2, and SPX3. Accordingly, the first electrodes ELT1 of each of the first to third sub-pixels SPX1, SPX2, and SPX3 may be separated from each other to receive an anode signal from each of the first to third pixel circuits PXC1, PXC2, and PXC3. According to an embodiment, the first source electrode SE1 of the first transistor M1 may be connected (e.g., electrically connected) to the first electrode ELT1 through a portion of the lower auxiliary electrode layer BML, a portion of the interlayer conductive layer ICL, and the first contact portion CNT1. Accordingly, the first electrode ELT1 may receive the driving signal.

For example, the pixel defining layer PDL may be selectively patterned in a partial area so that the light emitting layer EL of the light emitting element LD may be disposed. Accordingly, at least the pixel defining layer PDL may not be disposed on a partial area of the first electrode ELT1, and thus an area where the light emitting layer EL is disposed may be defined.

For example, a structure of the storage capacitor CST including the well portion 1000 is described with reference to FIGS. 9 to 12.

Figure 9:
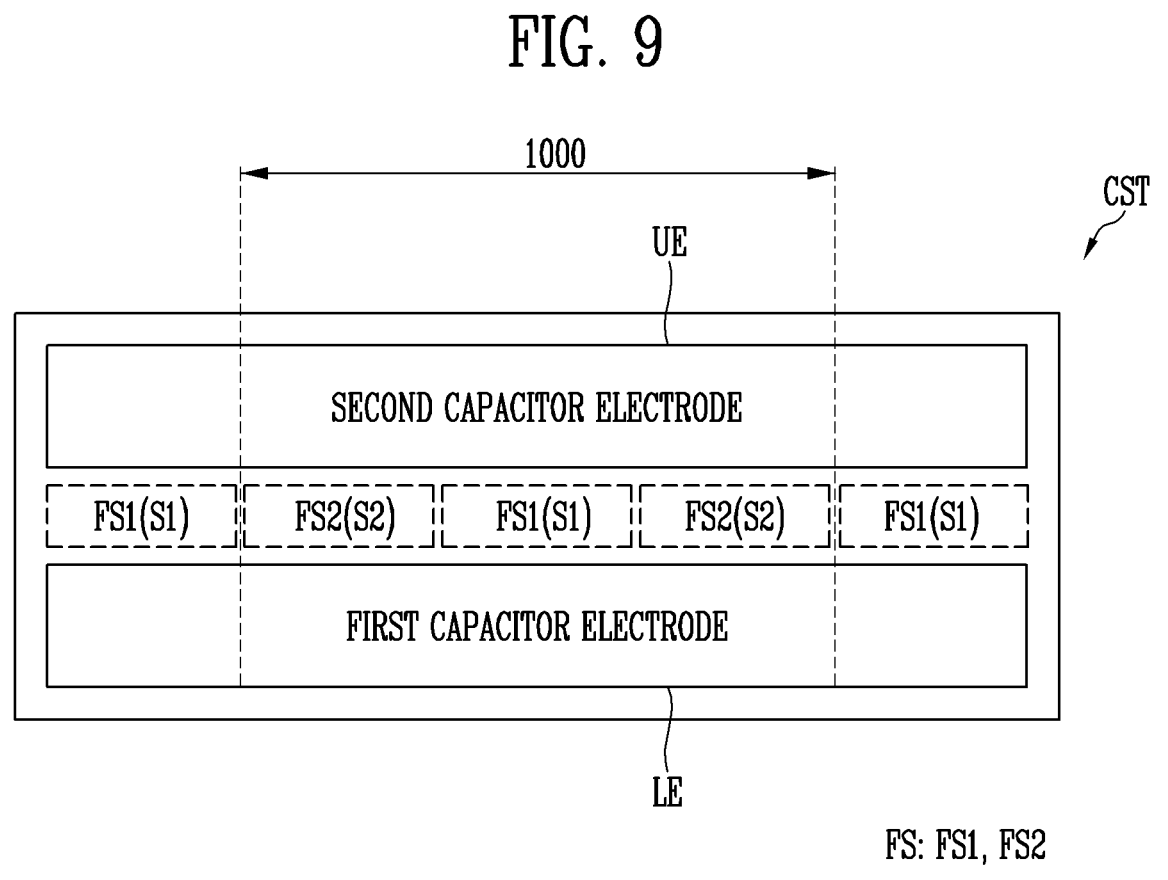
Figure 10:
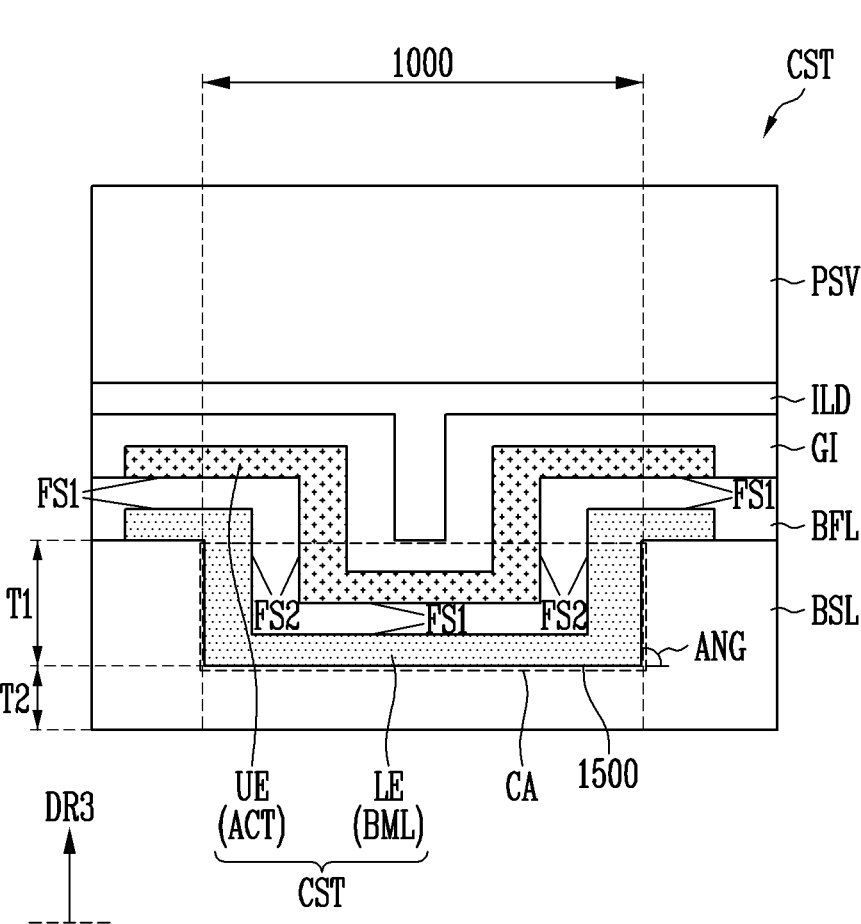
FIGS. 10 to 12 are schematic diagrams illustrating a storage capacitor according to an embodiment.
Figure 11:
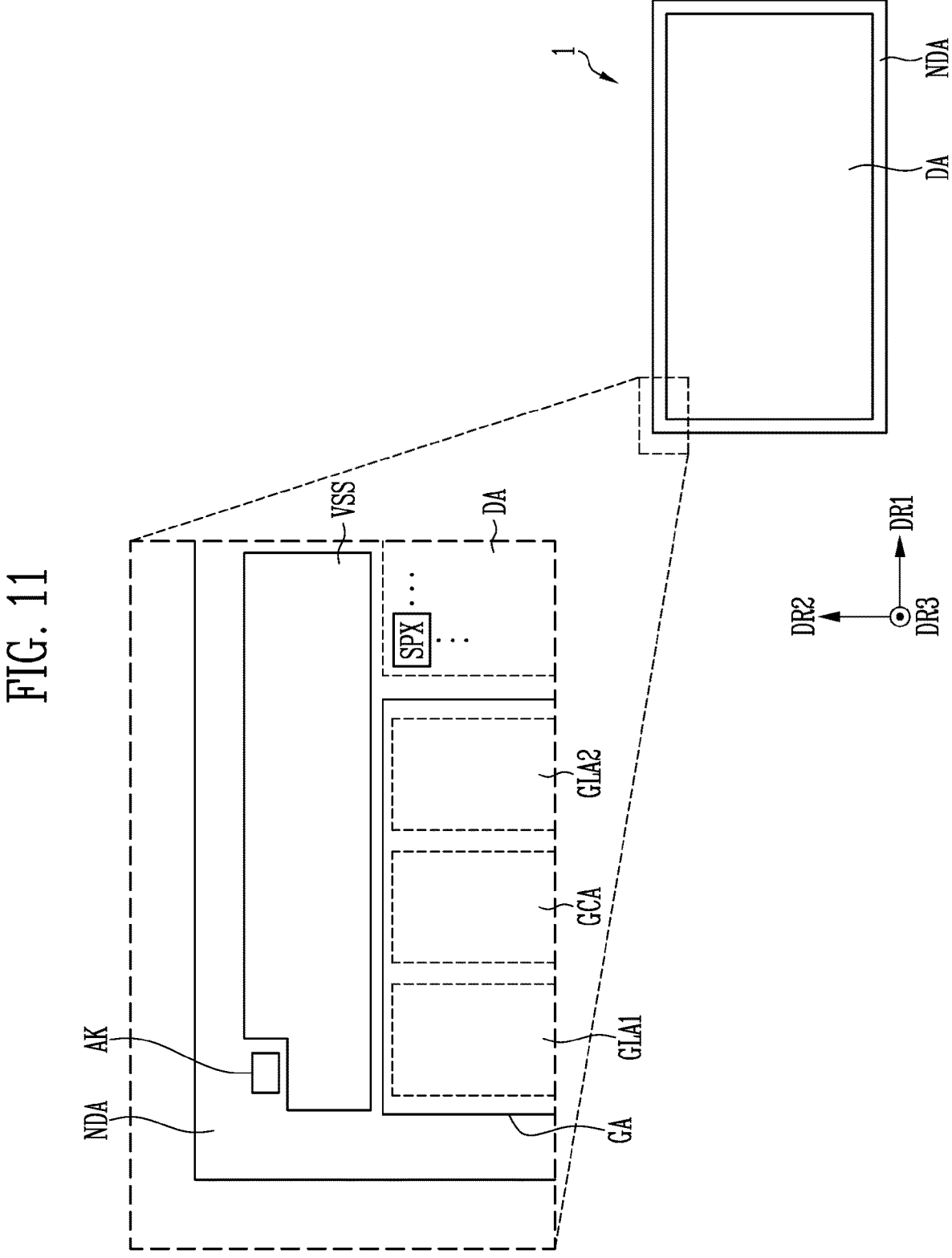
Figure 12:
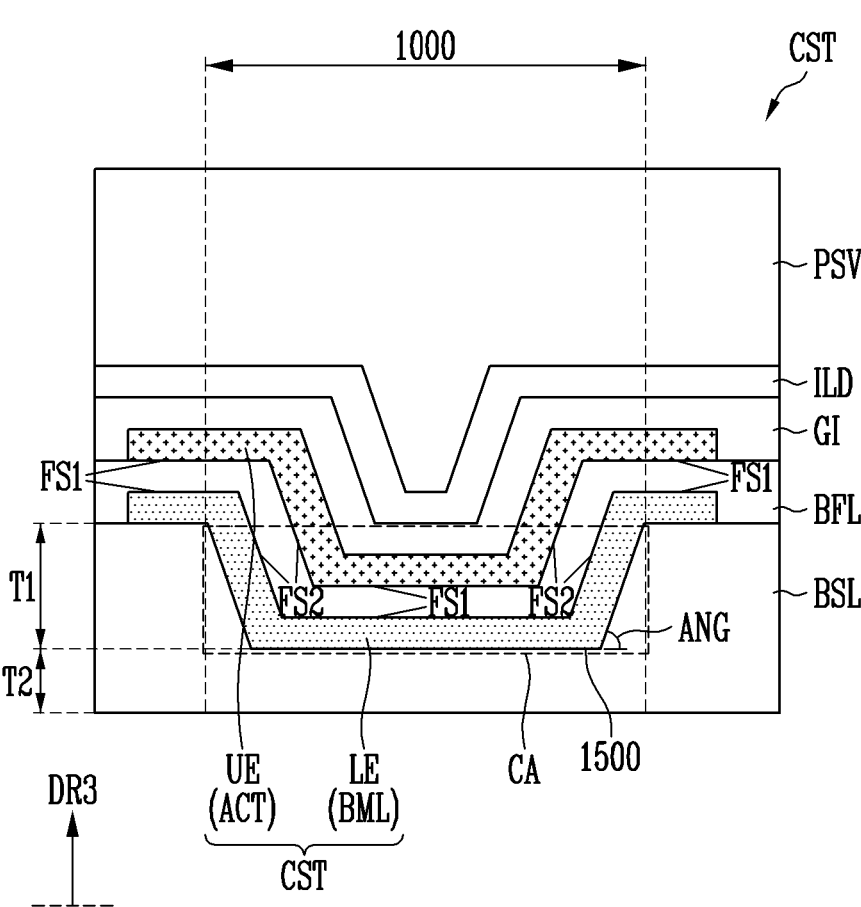

FIG. 9 is a schematic block diagram illustrating a structure of a storage capacitor according to an embodiment. FIGS. 10 to 12 are schematic diagrams illustrating a storage capacitor according to an embodiment. FIG. 10 may illustrate a schematic cross-sectional structure of a storage capacitor CST according to an embodiment. FIG. 11 is a schematic plan view illustrating a portion of a display device according to an embodiment. FIG. 12 may illustrate a schematic cross-sectional structure of a storage capacitor CST according to another embodiment.

Referring to FIGS. 9 to 12, the base layer BSL may include a concave portion (or recessed portion) CA from which at least a portion of the base layer BSL is removed. The concave portion CA may be an area recessed into at least a portion of the base layer BSL. The first capacitor electrode LE and the second capacitor electrode UE of the storage capacitor CST may include facing surfaces FS with an insulating layer (for example, the buffer layer BFL) interposed therebetween. Accordingly, a capacitance may be formed between the first capacitor electrode LE and the second capacitor electrode UE. The concave portion CA may be a cavity portion. The concave portion CA may be a well portion.

At least a portion of each of the first capacitor electrode LE and the second capacitor electrode UE may be disposed in the concave portion CA. Accordingly, at least a portion of each of the first capacitor electrode LE and the second capacitor electrode UE may extend along a first surface S1 and form first facing surfaces FS1. At least another portion of each of the first capacitor electrode LE and the second capacitor electrode UE may extend along a second surface S2 and form second facing surfaces FS2.

The first facing surfaces FS1 may be disposed between the first capacitor electrode LE and the second capacitor electrode UE in an area outside the well portion 1000 and a base area 1500 of the well portion 1000. The second facing surfaces FS2 may be disposed between the first capacitor electrode LE and the second capacitor electrode UE defined in a direction which is not a horizontal direction as the well portion 1000 is formed.

The first facing surfaces FS1 may extend along the first surface S1. The first surface S1 may be generally parallel to a plane direction of the base layer BSL. For example, the first surface S1 may be formed along a horizontal direction of the display device 1. The first surface S1 may be parallel to a plane defined by the first direction DR1 and the second direction DR2.

The second facing surfaces FS2 may extend along the second surface S2. The second surface S2 may generally extend in a direction different from the plane direction of the base layer BSL (for example, the horizontal direction of the display device 1). For example, a normal direction of the second surface S2 may be different from a thickness direction (or a normal direction) (for example, a third direction DR3) of the base layer BSL.

The normal direction may mean a direction perpendicular to an object for determining a direction. For example, a normal direction of the first facing surfaces FS1 may mean a direction of a normal to a plane of the first surface S1. A normal direction of the second facing surfaces FS2 may mean a direction of a normal to a plane of the second surface S2.

According to an embodiment, the capacitance of the storage capacitor CST may also be formed in the second facing surfaces FS2 along the direction different from the plane direction of the base layer BSL. For example, the capacitance of the storage capacitor CST may include the capacitance along the first surface S1 and the capacitance along the second surface S2, and thus the capacitance of the storage capacitor CST may be sufficiently ensured. For example, in a plan view, even though the area of the storage capacitor CST is the same, since the well portion 1000 is included and the capacitance is formed on the second facing surfaces FS2, the capacitance may be formed to be larger. Experimentally, in case that the pixel circuit PXC is manufactured, the planar area of the storage capacitor CST may affect process design. However, according to an embodiment, since the capacitance is formed in the second facing surfaces FS2 along the second surface S2 as well as the area of the storage capacitor CST on the plane, risk of the process design may be resolved.

According to an embodiment, in case that the display device 1 is a flexible display device, stress may occur inside. According to an embodiment, since the storage capacitor CST includes the well portion 1000, the area of the storage capacitor CST of a horizontal direction (for example, the direction along the first surface S1) may be minimized. Therefore, even though a deformation operation of a flexible display device is performed, such as a folding operation or a bending operation of the display device 1, the occurrence of the internal stress may be minimized. Accordingly, in case that the display device 1 is implemented as a flexible display device, sufficient operation performance may be ensured and a lifespan of the device may be further extended.

According to an embodiment, since the storage capacitor CST includes the well portion 1000, the non-display area NDA may be reduced. The non-display area NDA may be an area in which the pixel PXL is not disposed, and minimizing a size of the non-display area NDA may be advantageous. According to an embodiment, the area of the storage capacitor CST of the horizontal direction may be reduced, thereby preventing non-display area NDA from being formed.

For example, referring to FIG. 11, a gate driver area GA in which the gate driver 120 is disposed may be disposed in the non-display area NDA. According to an embodiment, an alignment key AK may be formed in the non-display area NDA, and the second power VSS for supplying the low potential power to the second power line PL2 may be formed.

According to an embodiment, the gate driver area GA may include a gate driving circuit area GCA where a gate circuit for forming the gate driver 120 is disposed, a first gate driving line area GLA1 connected (e.g., electrically connected) to the gate circuit and disposed on a side of the gate driving circuit area GCA, and a second gate driving line area GLA2 disposed on another side of the gate driving circuit area GCA. According to an embodiment, the gate circuit may include transistors and storage capacitors to provide the scan start signal and the clock signals. For example, the gate circuit may include three separate storage capacitors. According to an embodiment, the storage capacitors of the gate circuit formed in the gate driver area GA may also form the second facing surfaces FS2 (for example, facing surfaces which is not a horizontal surface), and may form a larger capacitance under the area on the same horizontal. For example, the area on the plane of the storage capacitor of the gate circuit, which is required in the horizontal direction to form the same capacitance, may be reduced. As a result, as the area of the gate driver area GA is reduced, the size of the non-display area NDA may be reduced.

A first thickness T1 and a second thickness T2 for defining a depth of the well portion 1000 may be determined according to a size of the capacitance. The storage capacitor CST may form a capacitance corresponding to the area of the second facing surfaces FS2 determined according to the first thickness T1. According to an embodiment, the first thickness T1 may be adjusted, and thus the capacitance along the second facing surfaces FS2 may be greater than the capacitance along the first facing surfaces FS1. However, embodiments are not limited thereto, and the capacitance along the second facing surfaces FS2 may be less than the capacitance along the first facing surfaces FS1.

The first thickness T1 may be a depth of the concave portion CA of the base layer BSL in the third direction DR3. The second thickness T2 may be a thickness of the base layer BSL in the concave portion CA. According to an embodiment, the first thickness T1 may be about 10% to about 95% of the thickness (e.g., T1+T2) of the base layer BSL. According to an embodiment, the first thickness T1 may be about 90% or less of the thickness (e.g., T1+T2) of the base layer BSL. For example, in case that the base layer BSL is a glass substrate and has a thickness of about 500 μm, the first thickness T1 may be about 490 μm or less. However, embodiments are not limited thereto.

According to an embodiment, a portion of each of the first capacitor electrode LE and the second capacitor electrode UE formed along the second surface S2 may have an angle ANG with the base layer BSL. According to an embodiment, the angle ANG may be greater than about 0 degrees and less than or equal to about 90 degrees. For example, the angle ANG may be about 90 degrees (refer to FIG. 10). In another example, the angle ANG may be an acute angle less than 90 degrees (FIG. 12). According to an embodiment, the angle ANG may be about 70 to 85 degrees. However, embodiments are not limited to a specific numerical range.

Referring to FIG. 8 together, the well portion 1000 may have a shape extending in a direction (for example, the second direction DR2) and may be formed in each of the storage capacitors CST. For example, the well portion 1000 may have a substantially rectangular shape including a long side and a short side in a plan view. According to an embodiment, a single well portion 1000 may be formed in each of the storage capacitors CST. However, embodiments are not limited thereto. An embodiment in which well portions 1000 are formed is described below with reference to FIGS. 15 and 16.

Figure 13:
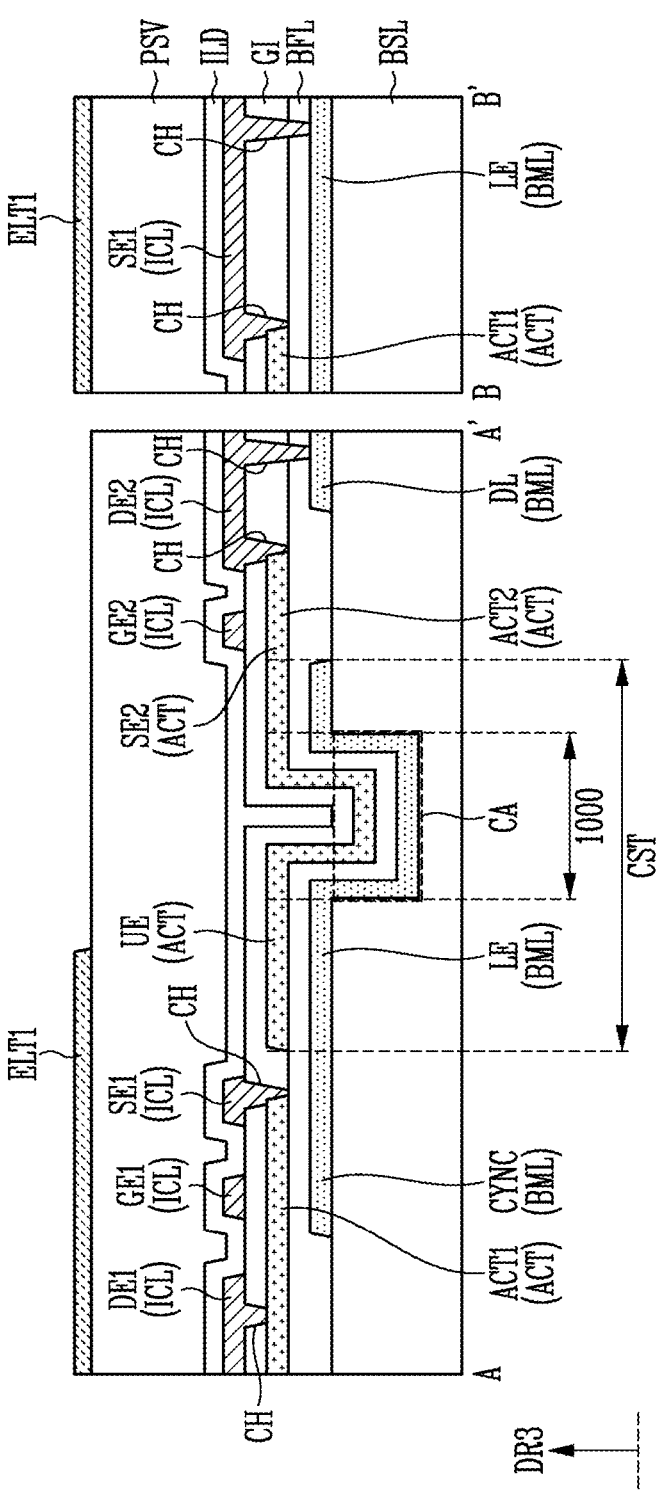
FIG. 13 is a schematic cross-sectional view along line A-A' and along line B-B' of FIG. 8.
Figure 14:
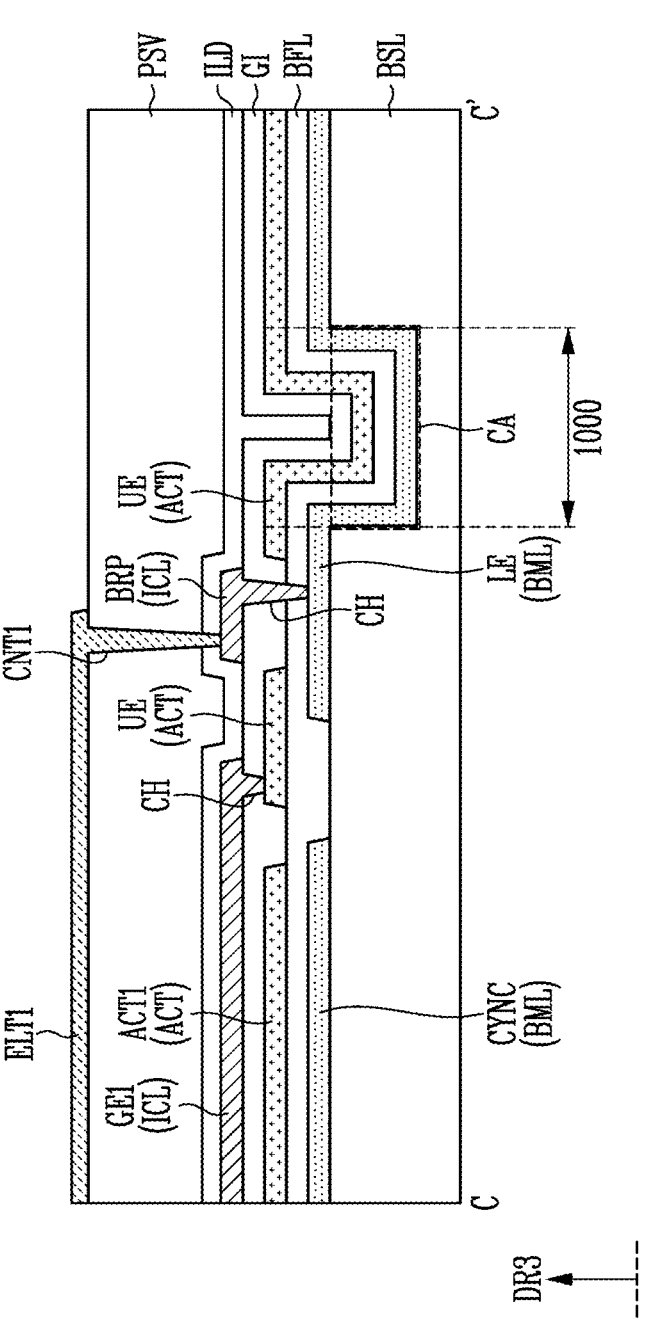
FIG. 14 is a schematic cross-sectional view along line C-C' of FIG. 8.

For example, the pixel circuit PXC is described in relation to a structure of the storage capacitor CST including the well portion 1000 with reference to FIGS. 13 and 14.

FIG. 13 is a schematic cross-sectional view along line A-A' and line B-B' of FIG. 8. FIG. 14 is a schematic cross-sectional view along line C-C' of FIG. 8.

Referring to FIGS. 13 and 14, the first capacitor electrode LE may be connected (e.g., electrically connected) to the first source electrode SE1, which is formed as the interlayer conductive layer ICL and connected (e.g., electrically connected) to the first active layer ACT1, through the contact member CH. The first capacitor electrode LE may be connected (e.g., electrically connected) to the sync electrode layer CYNC. The first capacitor electrode LE may be connected (e.g., electrically connected) to a bridge pattern layer BRP formed as the interlayer conductive layer ICL through the contact member CH, and the bridge pattern layer BRP may be connected (e.g., electrically connected) to the first electrode ELT1 through the first contact portion CNT1. According to an embodiment, since the bridge pattern layer BRP is formed on the interlayer conductive layer ICL without being formed on the active layer ACT, the bridge pattern layer BRP may be more spaced apart (or may be farther) from the base layer BSL than the second capacitor electrode UE is.

The second capacitor electrode UE may be connected (e.g., electrically connected) to the second drain electrode DE2 formed as the interlayer conductive layer ICL. The second capacitor electrode UE may be connected (e.g., electrically connected) to the data line DL formed as the lower auxiliary electrode layer BML. The data line DL may be connected (e.g., electrically connected) to the second capacitor electrode UE through the second drain electrode DE2, the second active layer ACT2, and the second source electrode SE2. The second capacitor electrode UE may be connected (e.g., electrically connected) to the first gate electrode GE1 through the contact member CH. At least a portion of the second capacitor electrode UE may overlap the second gate electrode GE2 in a plan view.

The first capacitor electrode LE and the data line DL may be disposed on the same layer (e.g., base layer BSL). The first capacitor electrode LE and the data line DL may be patterned in the same process, and may include (or may be formed of) the same material. The first capacitor electrode LE and the sync electrode layer CYNC may be disposed on the same layer (e.g., base layer BSL). The first capacitor electrode LE and the sync electrode layer CYNC may be patterned in the same process, and may include (or may be formed of) the same material.

The second capacitor electrode UE and the first active layer ACT1 may be disposed on the same layer (e.g., buffer layer BFL). The second capacitor electrode UE and the first active layer ACT1 may be patterned in the same process, and may include (or may be formed of) the same material.

According to an embodiment, the first capacitor electrode LE adjacent to the base layer BSL as the lower electrode of the storage capacitor CST may be connected (e.g., electrically connected) to the first source electrode SE1 of the first transistor M1 and the third source/drain electrode SE3 or DE3 of the third transistor M3. The second capacitor electrode UE relatively more spaced apart from the base layer BSL as the upper electrode of the storage capacitor CST may be connected (e.g., electrically connected) to the first gate electrode GE1 of the first transistor M1 and the second source/drain electrode SE2 or DE2 of the second transistor M2.

According to an embodiment, the first capacitor electrode LE and the second capacitor electrode UE may be patterned in a process different from that of the source electrodes SE1, SE2, and SE3 and the drain electrodes DE1, DE2, and DE3 and may be disposed on a layer different from that of the source electrodes SE1, SE2, and SE3 and the drain electrodes DE1, DE2, and DE3. The second capacitor electrode UE may be formed as the active layer ACT, and the storage capacitor CST may be disposed more adjacently (or closer) to the base layer BSL compared to the interlayer conductive layer ICL forming the source/drain electrodes. Accordingly, the well portion 1000 may be disposed more adjacent (or closer) to a groove forming the concave portion CA of the base layer BSL. For example, the well portion 1000 may form the second facing surfaces FS2 more widely within the concave portion CA.

At least a portion of the well portion 1000 may not overlap the first electrode ELT1 in a plan view. For example, a portion of the well portion 1000 may overlap the first electrode ELT1 in a plan view, and another portion of the well portion 1000 may not overlap the first electrode ELT1 in a plan view.

The well portion 1000 may not overlap the interlayer conductive layer ICL in a plan view. For example, in a plan view, the interlayer conductive layer ICL may not be disposed in an area where the well portion 1000 is disposed.

For example, a modified arrangement structure of the storage capacitor CST according to an embodiment is described with reference to FIGS. 15 to 17.

Figure 15:
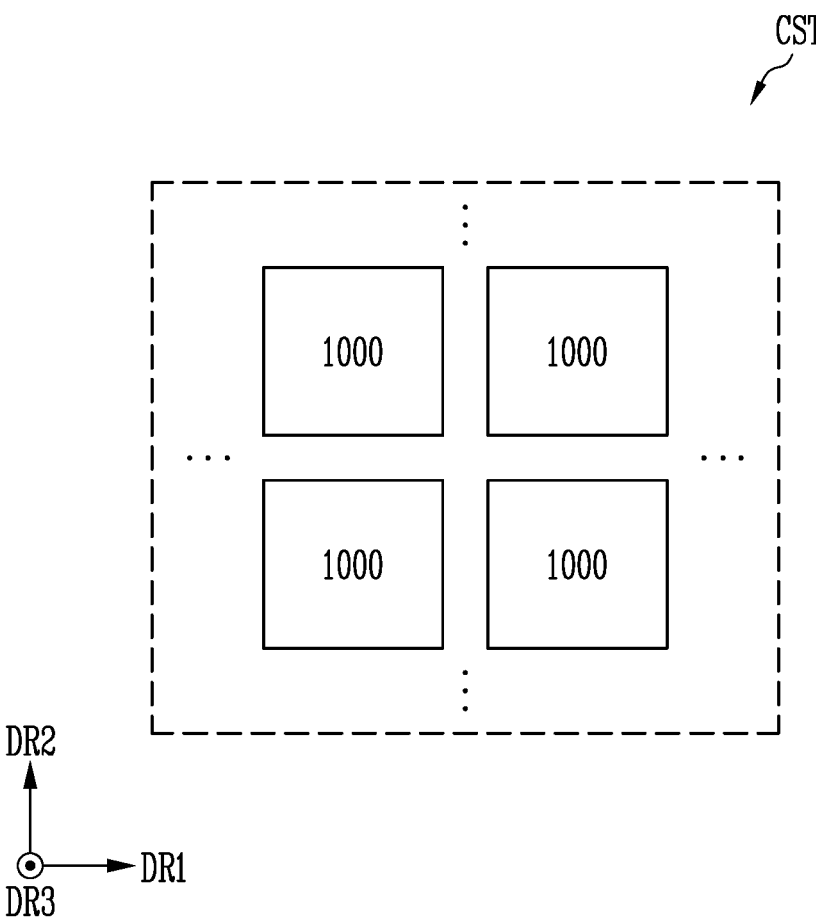
FIGS. 15 and 16 are schematic plan views illustrating arrangement structures of a storage capacitor according to an embodiment.
Figure 16:
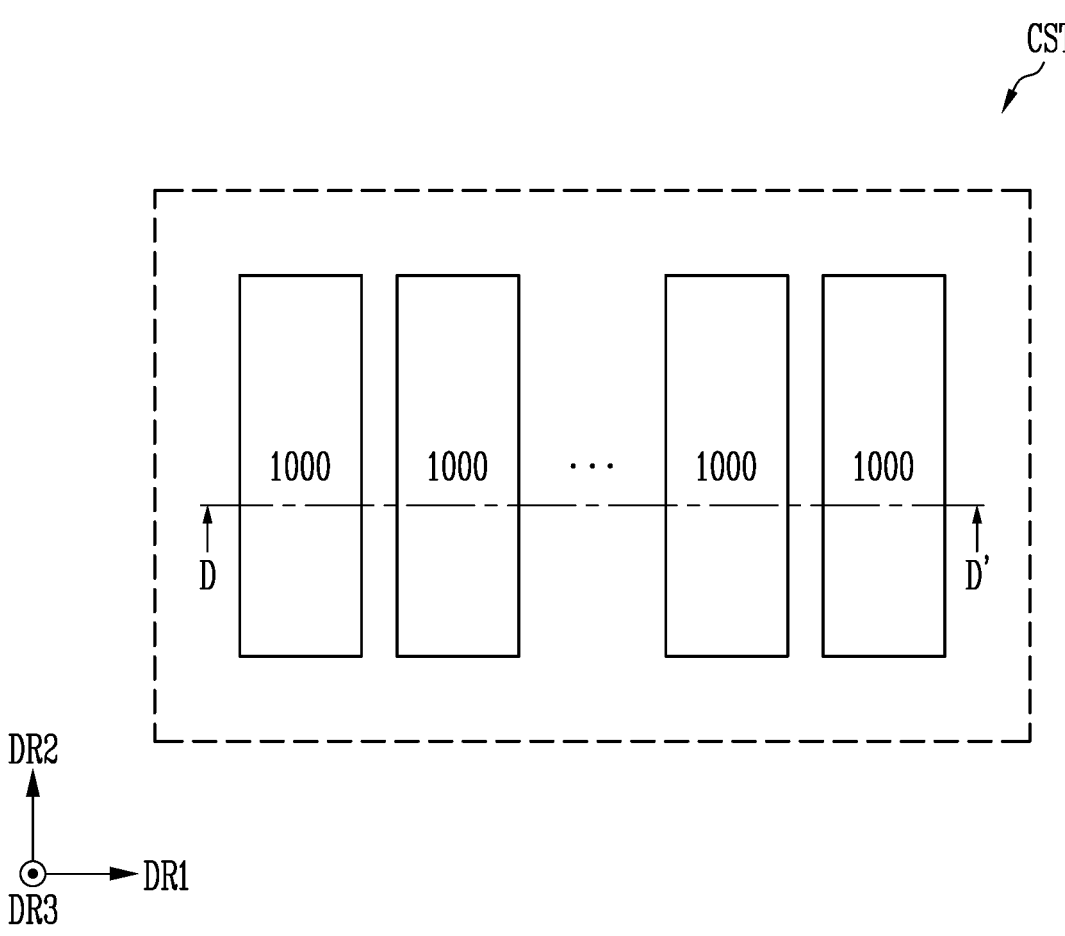

FIGS. 15 and 16 are schematic plan views illustrating arrangement structures of a storage capacitor according to an embodiment. FIG. 17 is a schematic cross-sectional view taken along line D-D' of FIG. 16.

Figure 17:
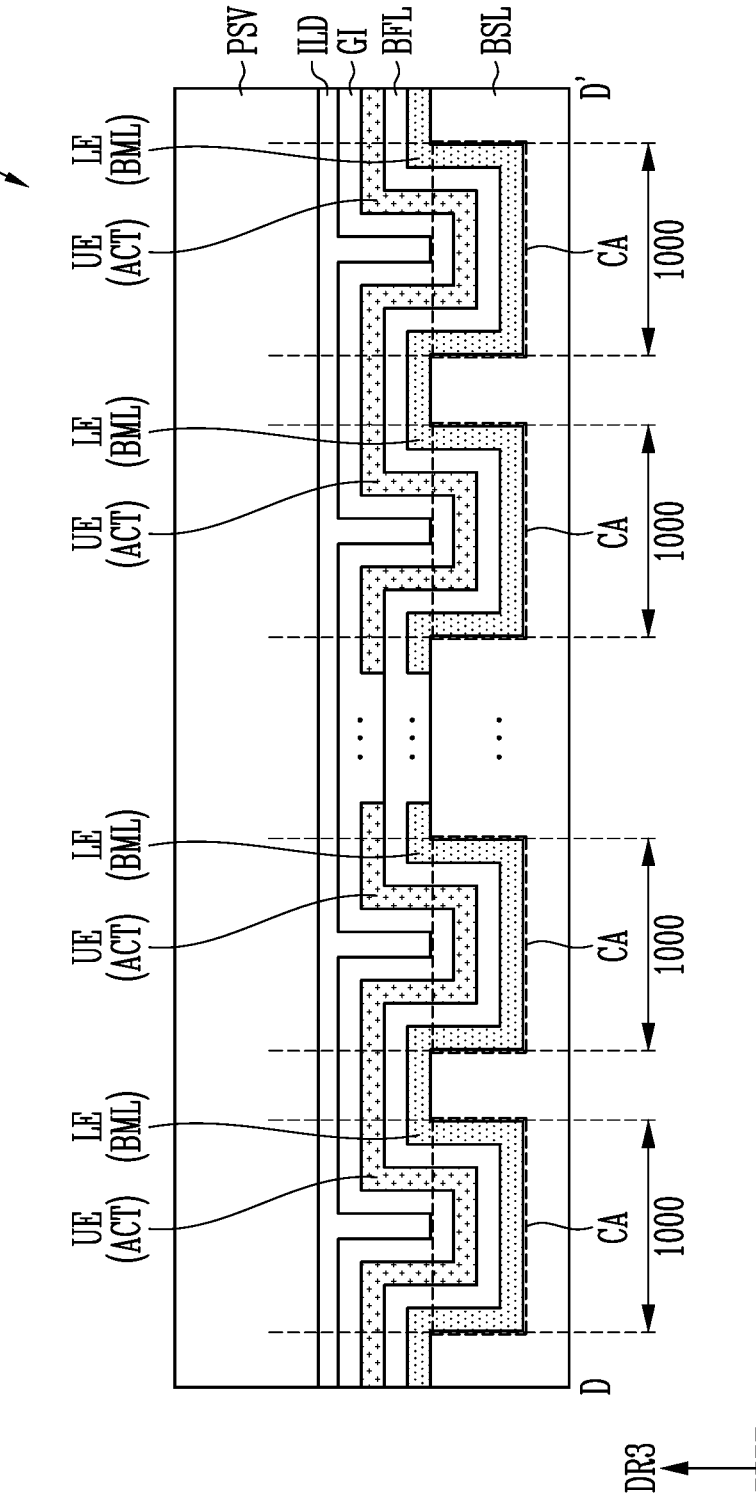
FIG. 17 is a schematic cross-sectional view taken along line D-D' of FIG. 16.

Referring to FIGS. 15 to 17, well portions 1000 may be provided in a single storage capacitor CST. For example, in order to sufficiently ensure the capacitance of the storage capacitor CST, the number of well portions 1000 may be increased.

According to an embodiment, referring to FIG. 15, the well portions 1000 may be arranged in a matrix shape along the first direction DR1 and the second direction DR2. For example, in a plan view, the well portions 1000 may be arranged along a row direction extending in the first direction DR1 and a column direction extending in the second direction DR2. For example, since a total capacitance of the storage capacitor CST is changed by the number of individual well portions 1000 having a relatively small size, a value of the capacitance of the storage capacitor CST may be controlled.

According to an embodiment, referring to FIGS. 16 and 17, the well portions 1000 may have a shape extending in the second direction DR2 and may be sequentially arranged along the first direction DR1. For example, the base layer BSL may include concave portions CA sequentially arranged along the first direction DR1 in a storage capacitor CST. For example, the first capacitor electrode LE and the second capacitor electrode UE may be disposed in each of the concave portions CA to form the well portions 1000. For example, a technical effect of further expanding the area of the second facing surfaces FS2 may be provided. For example, under the area of the storage capacitor CST in the same horizontal direction, as the second facing surfaces FS2 is formed, the area of the storage capacitor CST may be expanded and a larger capacitance may be formed.

For example, a positional relationship between the well portions 1000 according to an embodiment and other configurations is described with reference to FIG. 18.

Figure 18:
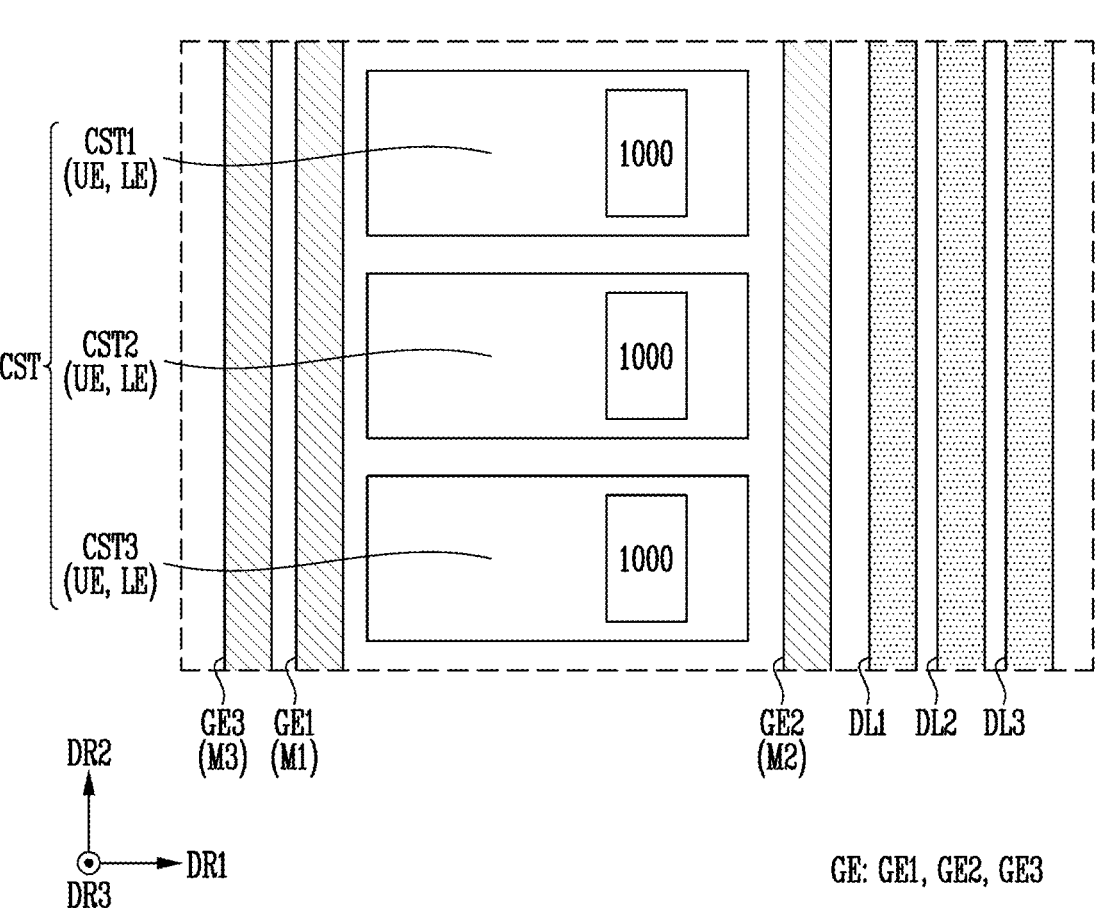
FIG. 18 is a schematic plan view illustrating a relationship between a well portion of a storage capacitor, gate lines, and data lines according to an embodiment.

FIG. 18 is a schematic plan view illustrating a relationship between a well portion of a storage capacitor, gate lines, and data lines according to an embodiment. FIG. 18 shows an embodiment in which the second gate electrode GE2 is disposed on a side of the storage capacitors CST and the first gate electrode GE1 and the third gate electrode GE3 are disposed on another side of the storage capacitors CST, e.g., in a plan view.

Referring to FIG. 18, the storage capacitors CST may be disposed between the gate electrodes GE, and thus the well portions 1000 may be disposed between the gate electrodes GE, e.g., in a plan view. The gate electrodes GE may include the first gate electrode GE1, the second gate electrode GE2, and the third gate electrode GE3. For example, the well portions 1000 may be disposed between the first gate electrode GE1 and the second gate electrode GE2, e.g., in a plan view. The well portions 1000 may be disposed between the third gate electrode GE3 and the second gate electrode GE2, e.g., in a plan view.

The well portions 1000 may have a shape extending in substantially the same direction as a direction in which the gate electrodes GE extend. For example, the gate electrodes GE may extend generally in the second direction DR2, and each of the well portions 1000 may extend generally in the second direction DR2. According to an embodiment, the well portions 1000 may have a quadrangular shape having a long side along the second direction DR2 and a short side along the first direction DR1.

The well portions 1000 may have a shape extending in substantially the same direction as a direction in which the data lines DL1, DL2, and DL3 extend. For example, the data lines DL1, DL2, and DL3 may extend generally in the second direction DR2, and each of the well portions 1000 may extend generally in the second direction DR2.

Referring to FIG. 2 together with FIG. 18, the well portions 1000 may have a shape extending in substantially the same direction as a direction in which the bending line BL extends. For example, the bending line BL may extend generally in the second direction DR2, and each of the well portions 1000 may extend generally in the second direction DR2. For example, stress that may be generated in case that the display device 1 is bent along the bending line BL may be prevented from damaging the display device 1.

For example, an embodiment in which the well portion 1000 is selectively formed in some of the storage capacitors CST is described with reference to FIG. 19.

Figure 19:
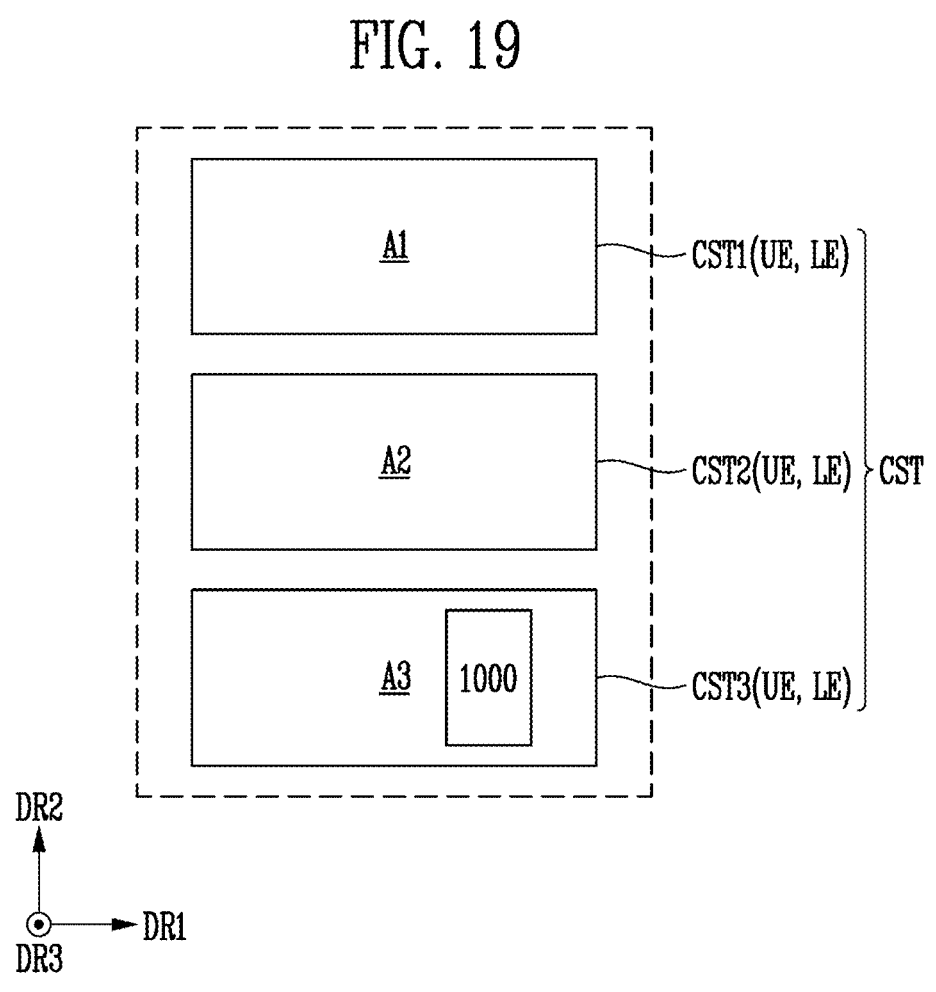

FIG. 19 is a schematic plan view illustrating the area of storage capacitors of sub-pixels according to an embodiment.

Referring to FIG. 19, the well portion 1000 may be selectively formed in one or more of the first storage capacitor CST1, the second storage capacitor CST2, and the third storage capacitor CST3.

For example, the well portion 1000 may not be formed in the first storage capacitor CST1 and the second storage capacitor CST2, and the well portion 1000 may be formed in the third storage capacitor CST3. However, embodiments are not limited thereto. In an embodiment, a structure in which the well portion 1000 is selectively formed in the third storage capacitor CST3 of the third sub-pixel SPX3 emitting light of the third color (for example, blue) is described.

According to an embodiment, a capacitance of the third storage capacitor CST3 may be relatively greater than a capacitance of the first storage capacitor CST1 and a capacitance of the second storage capacitor CST2. According to an embodiment, since the third storage capacitor CST3 further includes the well portion 1000, the area of a horizontal direction (for example, the first facing surfaces FS1) of the third storage capacitor CST3 may not be required to be excessively expanded. Accordingly, the areas A1, A2, and A3 of the first facing surfaces FS1 between the first storage capacitor CST1, the second storage capacitor CST2, and the third storage capacitor CST3 may be substantially the same, and the third storage capacitor CST3 may have a relatively larger capacitance by the formed well portion 1000. For example, total capacitances of the first storage capacitor CST1, the second storage capacitor CST2, and the third storage capacitor CST3 may be different, but the capacitances according to each first facing surfaces FS1 between the first storage capacitor CST1, the second storage capacitor CST2, and the third storage capacitor CST3 may be substantially equal to each other.

For example, in a plan view, a structure for forming the first capacitor electrode LE and the second capacitor electrode UE may be substantially equal to each other in each of the first storage capacitor CST1, the second storage capacitor CST2, and the third storage capacitor CST3. As a pattern structure on a plane between the first storage capacitor CST1, the second storage capacitor CST2, and the third storage capacitor CST3 may substantially correspond, a design degree of freedom of an electrode pattern layer may be improved. For example, since a structure of the electrodes is consistently formed, a space in the pixel circuit layer PCL may be efficiently utilized.

For example, a technical effect of the well portion 1000 is described in connection with a rear emission structure of the display device 1 with reference to FIG. 20.

Figure 20:
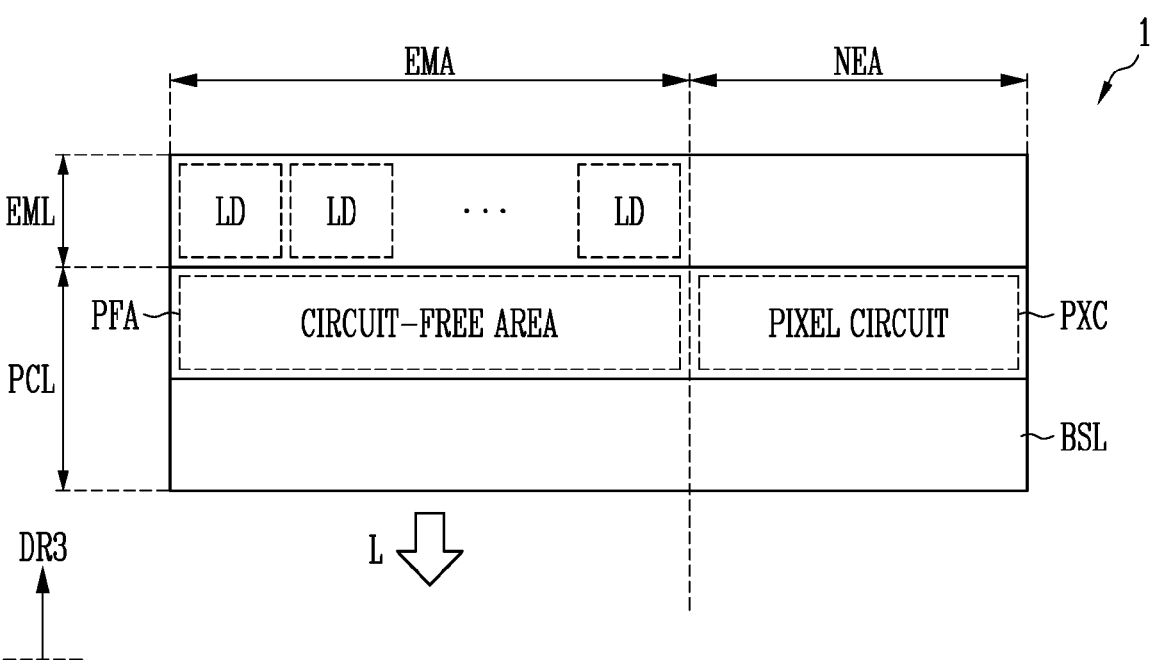
FIG. 20 is a schematic cross-sectional view illustrating an embodiment in which a display device has a rear emission structure.

FIG. 20 is a schematic cross-sectional view illustrating an embodiment in which a display device has a rear emission structure.

Referring to FIG. 20, the display device 1 according to an embodiment may have a rear emission structure. For example, light L emitted from the light emitting elements LD of the display device 1 may pass through the base layer BSL and may be emitted to an outside. In an embodiment, the base layer BSL may be a substrate or a film including a material capable of transmitting light.

The display device 1 may include an emission area EMA and a non-emission area NEA. The emission area EMA may be an area where the light emitting elements LD are disposed. The non-emission area NEA may be an area except for the emission area EMA. For example, the light emitting elements LD may not be disposed in the non-emission area NEA.

The pixel circuit layer PCL may include a circuit-free area PFA in which the pixel circuit PXC is not disposed. For example, a reflective structure may not be substantially formed in the circuit-free area PFA, and the light L may pass through the circuit-free area PFA. The emission area EMA may overlap the circuit-free area PFA in a plan view. The non-emission area NEA may overlap the pixel circuit PXC in a plan view.

The area through which the light L is transmitted is required to be formed so that the display device 1 has the rear emission structure, and the circuit-free area PFA is required to be sufficiently expanded. For example, reducing the area where the pixel circuit PXC is disposed may be advantageous to implement the rear emission structure. According to an embodiment, the storage capacitor CST may include the well portion 1000, and thus the area of the storage capacitor CST of the horizontal direction required to ensure the same capacitance may be reduced. For example, the area required to form the pixel circuit PXC may be substantially reduced. For example, the circuit-free area PFA may be further expanded, and a luminance of the display device 1 implemented as the rear emission structure may be improved.

For example, a structure of electrodes of a display device 1 according to another embodiment is described with reference to FIGS. 21 and 22. A description of a content that is same as (or similar to) the above-described content is simplified or is not repeated for descriptive convenience.

Figure 21:
FIG. 21 is a schematic cross-sectional view illustrating a stack structure of a display device according to another embodiment.
Figure 21:
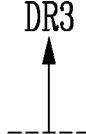

FIG. 21 is a schematic cross-sectional view illustrating a stack structure of a display device according to another embodiment. FIG. 22 is a schematic cross-sectional view illustrating a storage capacitor according to another embodiment.

Figure 22:
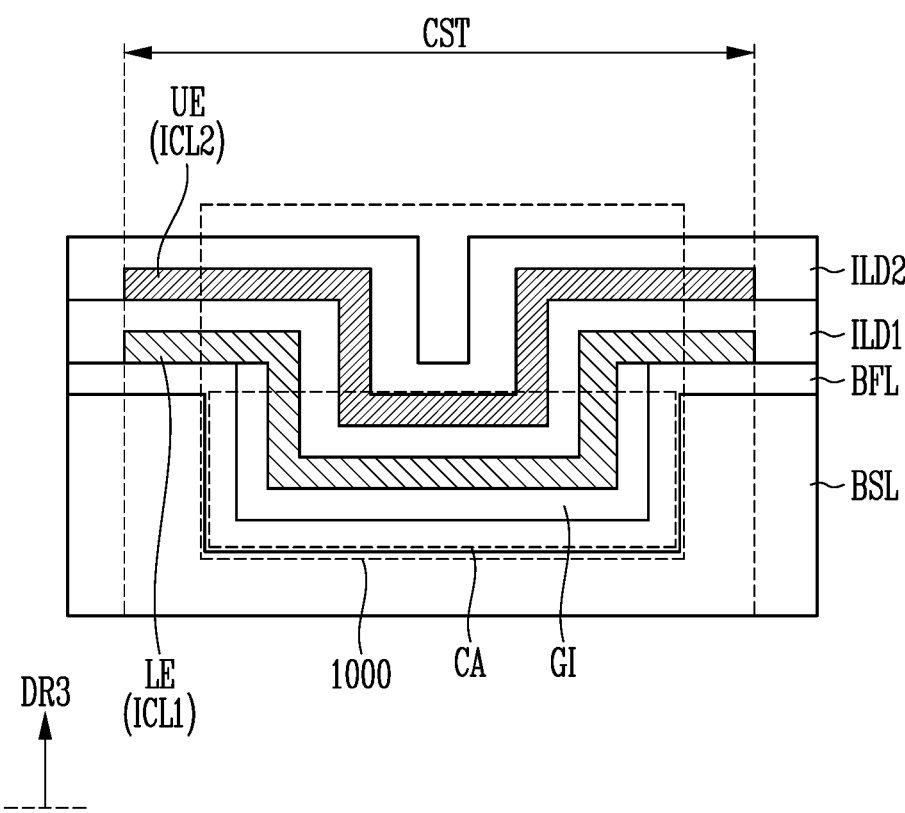
FIG. 22 is a schematic cross-sectional view illustrating a storage capacitor according to another embodiment.

Referring to FIGS. 21 and 22, the display device 1 according to another embodiment is different from the display device 1 according to an embodiment in that a second interlayer conductive layer ICL2 is further included.

According to an embodiment, the pixel circuit layer PCL may have a structure in which the lower auxiliary electrode layer BML, the buffer layer BFL, the active layer ACT, the gate insulating layer GI, a first interlayer conductive layer ICL1, a first interlayer insulating layer ILD1, the second interlayer conductive layer ICL2, a second interlayer insulating layer ILD2, and the protective layer PSV are sequentially stacked on the base layer BSL.

For example, the second interlayer conductive layer ICL2 may form the source electrodes SE1, SE2, and SE3 and the drain electrodes DE1, DE2, and DE3 of the respective first to third transistors M1 to M3, the first interlayer conductive layer ICL1 may form the gate electrodes GE1, GE2, and GE3 of the first to third transistors M1 to M3.

The first capacitor electrode LE of the storage capacitor CST may be formed as the first interlayer conductive layer ICL1. The second capacitor electrode UE of the storage capacitor CST may be formed as the second interlayer conductive layer ICL2. Accordingly, the second capacitor electrode UE and the first capacitor electrode LE may form the facing surfaces FS with the first interlayer insulating layer ILD1 interposed therebetween. Similarly to that described above, the base layer BSL may include the concave portion CA, and at least a portion of each of the second capacitor electrode UE and the first capacitor electrode LE may be disposed in the concave portion CA, and thus the well portion 1000 may be formed. Accordingly, the second capacitor electrode UE and the first capacitor electrode LE may include the first facing surfaces FS1 corresponding to the first surface S1, and may include the second facing surfaces FS2 corresponding to the second surface S2.

For example, a manufacturing method for a display device 1 according to an embodiment is described with reference to FIGS. 23 to 26. A description of a content that is same as (or similar to) the above-described content is simplified or is not repeated for descriptive convenience.

FIGS. 23 to 26 are schematic cross-sectional views for each process step illustrating a manufacturing method for a display device according to an embodiment. FIGS. 23 to 26 show a cross-sectional structure of the display device 1 based on the cross-sectional view taken along line A-A' described above with reference to FIG. 13. Layers formed on the base layer BSL in FIGS. 23 to 26 may be manufactured (or formed) by patterning a conductive layer (or a metal layer), an inorganic material, an organic material, or the like by performing a process by using a general mask.

Figure 23:
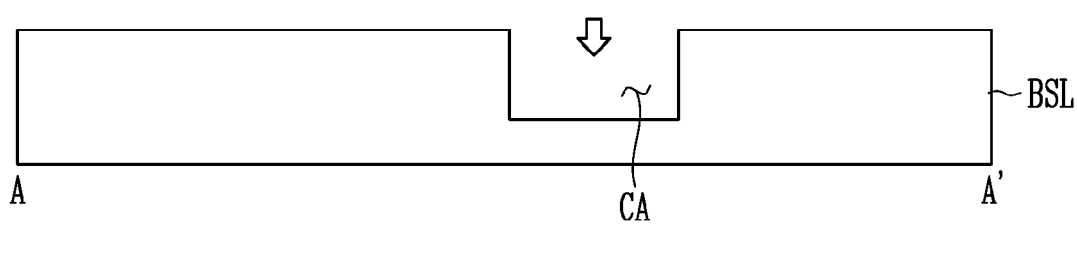
FIGS. 23 to 26 are schematic cross-sectional views for each process step illustrating a manufacturing method for a display device according to an embodiment.
Figure 23:
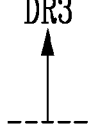

Referring to FIG. 23, the concave portion CA may be formed by removing at least a portion of the base layer BSL. For example, as a subsequent process is performed, the concave portion CA may be formed at a position where the well portion 1000 is to be formed.

For example, a portion of the base layer BSL may be removed by various methods. For example, a wet etching process or a laser process may be performed to form the concave portion CA. However, embodiments are not limited to specific examples.

For example, in case that the base layer BSL includes a glass substrate, a wet etching process may be performed to form the concave portion CA. In another example, in case that the base layer BSL includes an insulating material such as a polymer resin such as polyimide, a laser process may be performed to form the concave portion CA. According to an embodiment, a laser may be light of a UV wavelength band (for example, a wavelength band including about 343 nm).

Figure 24:
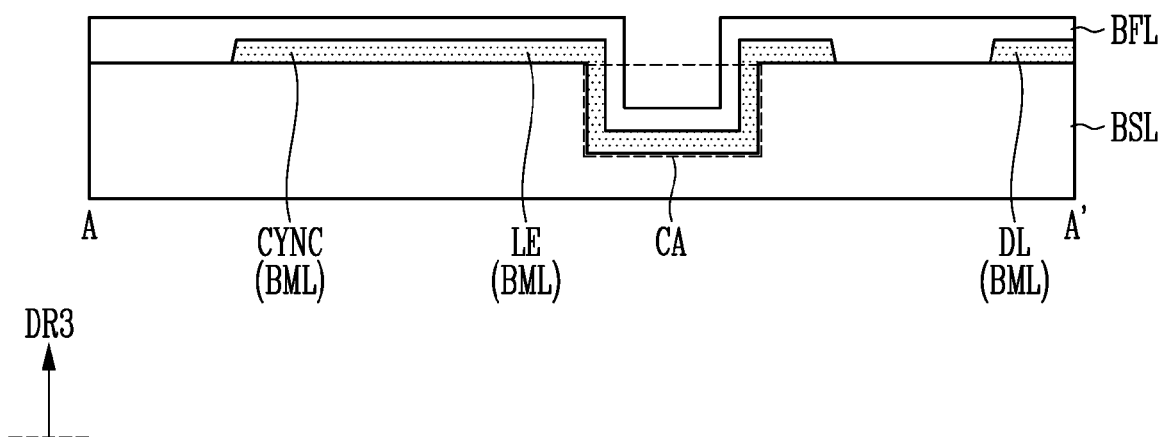

Referring to FIG. 24, the lower auxiliary electrode layer BML may be patterned on the base layer BSL, and the buffer layer BFL may be formed (or deposited) on the lower auxiliary electrode layer BML.

For example, the lower auxiliary electrode layer BML may be patterned to form the first capacitor electrode LE, the sync electrode layer CYNC, and the data line DL. At least a portion of the lower auxiliary electrode layer BML may be disposed in the concave portion CA, and thus at least a portion of the first capacitor electrode LE may be formed in the concave portion CA. At least a portion of the first capacitor electrode LE may extend in a direction different from the plane direction of the base layer BSL (for example, a plane direction parallel to the second surface S2).

Figure 25:
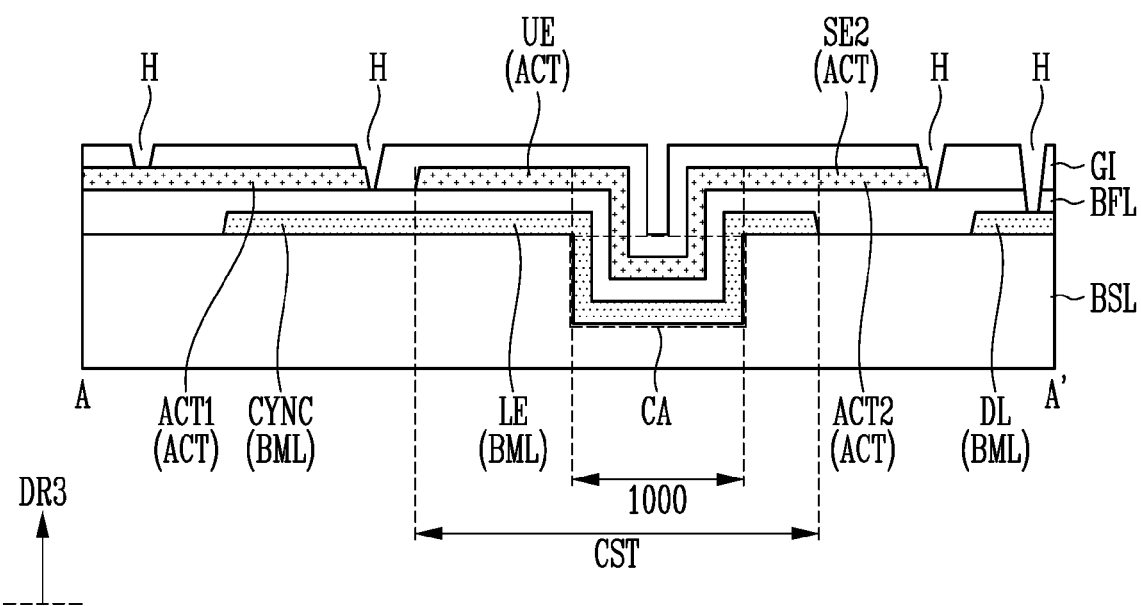

Referring to FIG. 25, the active layer ACT may be patterned on the buffer layer BFL, and the gate insulating layer GI may be formed (or deposited) on the active layer ACT. For example, holes H may be formed in the gate insulating layer GI and the buffer layer BFL.

For example, the active layer ACT may be patterned to form the first active layer ACT1, the second capacitor electrode UE, and the second source electrode SE2. The first capacitor electrode LE and the second capacitor electrode UE may form the storage capacitor CST, and the well portion 1000 may be formed. At least a portion of the active layer ACT may be disposed in the concave portion CA, and thus at least a portion of the second capacitor electrode UE may be formed in the concave portion CA. At least a portion of the second capacitor electrode UE may extend in the direction different from the plane direction of the base layer BSL (for example, the plane direction parallel to the second surface S2).

For example, the first capacitor electrode LE and the second capacitor electrode UE may include the facing surfaces FS. At this time, within the concave portion CA, the first capacitor electrode LE and the second capacitor electrode UE may include the second facing surfaces FS2 in a direction different from the horizontal direction, and an expanded capacitance may be formed as described above.

For example, at least a portion of each of the gate insulating layer GI and the buffer layer BFL may be removed to form the holes H. In the holes H, a conductive layer may be provided to form the contact members CH. According to an embodiment, the holes H may expose at least a portion of each of the active layer ACT and the lower auxiliary electrode layer BML.

Figure 26:
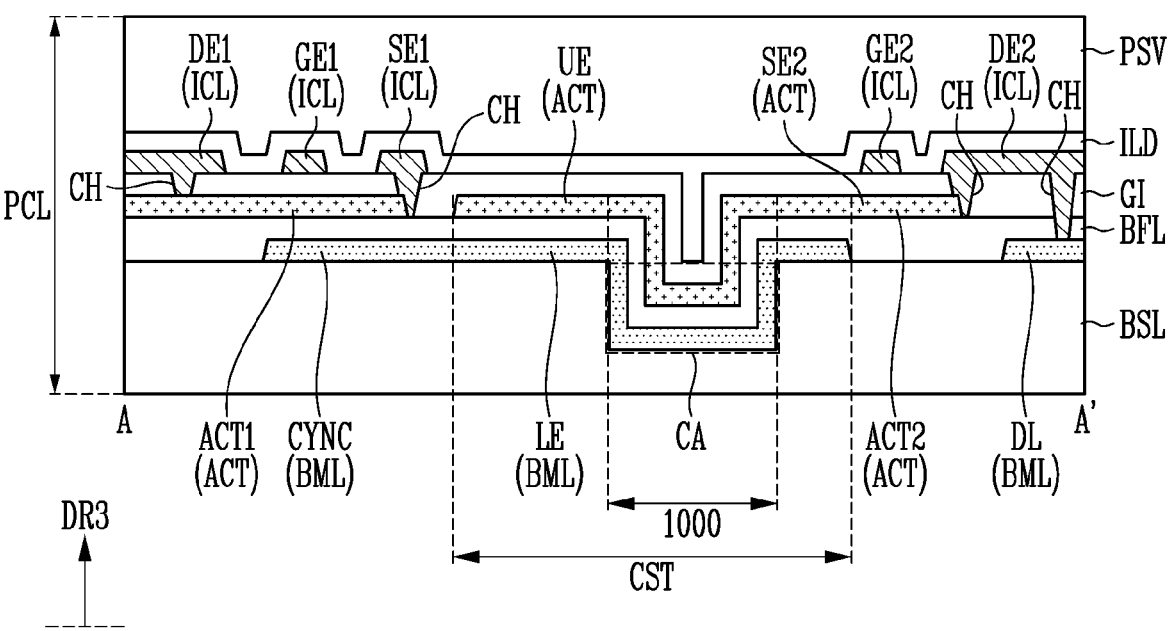

Referring to FIG. 26, the interlayer conductive layer ICL may be patterned on the gate insulating layer GI and the active layer ACT, the interlayer insulating layer ILD may be formed (or deposited) on the interlayer conductive layer ICL, and the protective layer PSV may be formed (or deposited) on the interlayer insulating layer ILD. Accordingly, the pixel circuit layer PCL according to an embodiment may be provided.

For example, the interlayer conductive layer ICL may be patterned to form the first drain electrode DE1, the first gate electrode GE1, the first source electrode SE1, the second gate electrode GE2, and the second drain electrode DE2. For example, at least a portion of the interlayer conductive layer ICL may be provided in the holes H to form the contact member CH. According to an embodiment, the first drain electrode DE1 and the first source electrode SE1 may be connected (e.g., electrically connected) to the first active layer ACT1 through the contact member CH, and the second drain electrode DE2 may be connected (e.g., electrically connected) to the second source electrode SE2 and the data line DL through the contact member CH.

Although the disclosure has been described with reference to the embodiments above, those skilled in the art or those having a common knowledge in the art will understand that the disclosure may be variously modified and changed without departing from the spirit and technical area of the disclosure described in the claims which will be described below.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a pixel circuit layer including a base layer and a pixel circuit disposed on the base layer; and
a light emitting element disposed on the base layer and electrically connected to the pixel circuit, wherein
the pixel circuit includes:
a transistor, and
a storage capacitor including a first capacitor electrode and a second capacitor electrode, wherein
the base layer includes a concave portion, and at least a portion of each of the first capacitor electrode and the second capacitor electrode is disposed in the concave portion, facing surfaces facing each other, an insulating layer disposed between the facing surfaces,
the facing surfaces includes first facing surfaces and second facing surfaces,
the first facing surfaces extend along a first surface,
the second facing surfaces extend along a second surface different from the first surface, and
a normal direction of the second surface is different from a thickness direction of the base layer.

2. The display device according to claim 1, wherein the concave portion has a bottom surface, and a depth of the concave portion is less than a length of the bottom surface.

3. The display device according to claim 1, wherein a depth of the concave portion is about 10% to about 95% of a thickness of the base layer.

4. The display device according to claim 1, wherein
the storage capacitor includes a well portion in the concave portion,
the pixel circuit layer includes a lower auxiliary electrode layer, an active layer, and an interlayer conductive layer for forming the pixel circuit,
the first capacitor electrode is formed as the lower auxiliary electrode layer, and the second capacitor electrode is formed as the active layer.

5. The display device according to claim 4, wherein
the transistor includes a driving transistor,
a first source electrode and a first drain electrode of the driving transistor are formed as the interlayer conductive layer, and
the first capacitor electrode and the second capacitor electrode of the storage capacitor and the first source electrode and the first drain electrode of the driving transistor are formed on different layers, respectively.

6. The display device according to claim 5, further comprising:
a sync conductive layer overlapping a first gate electrode of the driving transistor in a plan view and formed as the lower auxiliary electrode layer,
wherein the first capacitor electrode is electrically connected to the first source electrode and the sync conductive layer, and is electrically connected to an anode electrode of the light emitting element through a bridge pattern layer formed as the interlayer conductive layer.

7. The display device according to claim 5, further comprising: a data line electrically connected to the pixel circuit, wherein
the transistor further includes a switching transistor electrically connected to the data line, and
a direction in which the data line extends and a direction in which the well portion extends are parallel.

8. The display device according to claim 5, further comprising: a data line electrically connected to the pixel circuit, wherein
the transistor further includes a switching transistor electrically connected to the data line, and
the well portion is disposed between a first gate electrode of the driving transistor and a second gate electrode of the switching transistor in a plan view.

9. The display device according to claim 8, wherein a direction in which the first gate electrode and the second gate electrode extend and a direction in which the well portion extends are parallel.

10. The display device according to claim 8, wherein
the second capacitor electrode and a second source electrode of the switching transistor are integral with each other, and the second capacitor electrode and a second drain electrode of the switching transistor are integral with each other.

11. The display device according to claim 5, wherein the well portion does not overlap the interlayer conductive layer in a plan view.

12. The display device according to claim 1, further comprising:
a first sub-pixel, a second sub-pixel, and a third sub-pixel each including the light emitting element, wherein
the storage capacitor includes a well portion in the concave portion,
the storage capacitor includes a first storage capacitor in the first sub-pixel, a second storage capacitor in the second sub-pixel, and a third storage capacitor in the third sub-pixel, and
each of the first storage capacitor, the second storage capacitor, and the third storage capacitor includes the well portion.

13. The display device according to claim 1, further comprising:
a first sub-pixel, a second sub-pixel, and a third sub-pixel each including the light emitting element, wherein
the storage capacitor includes a well portion in the concave portion,
the storage capacitor includes a first storage capacitor in the first sub-pixel, a second storage capacitor in the second sub-pixel, and a third storage capacitor in the third sub-pixel,
the well portion is not formed in the first storage capacitor and the second storage capacitor,
the well portion is formed in the third storage capacitor, and
a capacitance of the third storage capacitor is greater than a capacitance of the first storage capacitor and a capacitance of the second storage capacitor.

14. The display device according to claim 13, wherein areas of each of the first storage capacitor, the second storage capacitor, and the third storage capacitor are substantially equal to each other in a plan view.

15. The display device according to claim 13, wherein structures of each of the first storage capacitor, the second storage capacitor, and the third storage capacitor are substantially same as each other in a plan view.

16. The display device according to claim 1, wherein
the pixel circuit layer includes a circuit-free area in which the pixel circuit is not disposed, and
the base layer is configured to transmit light so that the display device has a rear emission structure.

17. The display device according to claim 1, wherein
the storage capacitor includes a well portion in the concave portion, and
the well portion has a shape including a long side extending in a first direction and a short side extending in a second direction different from the first direction.

18. The display device according to claim 1, wherein
the storage capacitor includes a well portion in the concave portion,
the well portion includes a plurality of well portions, and
the plurality of well portions are arranged in a matrix structure in a row direction along a first direction and a column direction along a second direction different from the first direction.

19. The display device according to claim 1, wherein
the storage capacitor includes a well portion in the concave portion,
the well portion includes a plurality of well portions, and the plurality of well portions are sequentially arranged along a direction.

20. The display device according to claim 1, wherein the light emitting element is an organic light emitting diode (OLED).

21. The display device according to claim 1, wherein the display device is one or more of a bendable display device, a curved display device, and a foldable display device.

22. The display device according to claim 21, wherein
the display device is bendable along a bending line,
the storage capacitor includes a well portion in the concave portion, and
a direction in which the bending line extends and a direction in which the well portion extends is same as each other.

23. The display device according to claim 1, wherein
the transistor includes:
a gate electrode formed as a first interlayer conductive layer, and
a source electrode and a drain electrode formed as a second interlayer conductive layer on the first interlayer conductive layer,
the first capacitor electrode is formed as the first interlayer conductive layer, and
the second capacitor electrode is formed as the second interlayer conductive layer.

24. An electronic device comprising:
a pixel circuit layer including a base layer and a pixel circuit disposed on the base layer; and
a light emitting element disposed on the base layer and electrically connected to the pixel circuit, wherein
the pixel circuit includes:
a transistor, and
a storage capacitor including a first capacitor electrode and a second capacitor electrode, wherein
the base layer includes a concave portion, and at least a portion of each of the first capacitor electrode and the second capacitor electrode is disposed in the concave portion,
facing surfaces facing each other, an insulating layer disposed between the facing surfaces,
the facing surfaces includes first facing surfaces and second facing surfaces,
the first facing surfaces extend along a first surface,
the second facing surfaces extend along a second surface different from the first surface, and
a normal direction of the second surface is different from a thickness direction of the base layer.

25. A flexible display device foldable along a bending line, the flexible display device comprising:
a base layer including a recessed portion;
a pixel circuit including a storage capacitor including capacitor electrodes disposed in the recessed portion; and
a light emitting element electrically connected to the pixel circuit,
wherein the recessed portion has a shape extending along the bending line.

26. A display device comprising:
a pixel circuit layer including a base layer and a pixel circuit disposed on the base layer; and
a light emitting element disposed on the base layer and electrically connected to the pixel circuit, wherein
the pixel circuit includes:
a transistor, and
a storage capacitor including a first capacitor electrode and a second capacitor electrode, the base layer includes a concave portion, and at least a portion of each of the first capacitor electrode and the second capacitor electrode is disposed in the concave portion, wherein a depth of the concave portion is about 10% to about 95% of a thickness of the base layer.

27. The display device according to claim 26, wherein the storage capacitor includes a well portion in the concave portion, the pixel circuit layer includes a lower auxiliary electrode layer, an active layer, and an interlayer conductive layer for forming the pixel circuit, the first capacitor electrode is formed as the lower auxiliary electrode layer, and the second capacitor electrode is formed as the active layer.

28. The display device according to claim 27, wherein the transistor includes a driving transistor, a first source electrode and a first drain electrode of the driving transistor are formed as the interlayer conductive layer, and the first capacitor electrode and the second capacitor electrode of the storage capacitor and the first source electrode and the first drain electrode of the driving transistor are formed on different layers, respectively.

29. The display device according to claim 28, further comprising:

a sync conductive layer overlapping a first gate electrode of the driving transistor in a plan view and formed as the lower auxiliary electrode layer, wherein the first capacitor electrode is electrically connected to the first source electrode and the sync conductive layer, and is electrically connected to an anode electrode of the light emitting element through a bridge pattern layer formed as the interlayer conductive layer.

30. The display device according to claim 28, further comprising: a data line electrically connected to the pixel circuit, wherein the transistor further includes a switching transistor electrically connected to the data line, and a direction in which the data line extends and a direction in which the well portion extends are parallel.

\* \* \* \* \*